US012813100B2

(12) United States Patent
Yuan et al.

(10) Patent No.: US 12,813,100 B2
(45) Date of Patent: Nov. 24, 2026

(54) DISPLAY SUBSTRATE AND DISPLAY APPARATUS

(71) Applicants: Hefei BOE Joint Technology Co., Ltd., Hefei (CN); BOE Technology Group Co., Ltd., Beijing (CN)

(72) Inventors: Zhidong Yuan, Beijing (CN); Yongqian Li, Beijing (CN); Li Sun, Beijing (CN); Liu Wu, Beijing (CN); Can Yuan, Beijing (CN)

(73) Assignees: Hefei BOE Joint Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 948 days.

(21) Appl. No.: 18/018,550

(22) PCT Filed: Feb. 25, 2022

(86) PCT No.: PCT/CN2022/078073
§ 371 (c)(1),
(2) Date: Jan. 28, 2023

(87) PCT Pub. No.: WO2023/159510
PCT Pub. Date: Aug. 31, 2023

(65) Prior Publication Data
US 2024/0260343 A1 Aug. 1, 2024

(51) Int. Cl.
*H10K 59/131* (2023.01)
*G09G 3/32* (2016.01)

(52) U.S. Cl.
CPC ............. *H10K 59/131* (2023.02); *G09G 3/32* (2013.01); *G09G 2310/0281* (2013.01); *G09G 2310/0286* (2013.01)

(58) Field of Classification Search
CPC ............................... H10K 59/131; G09G 3/32
See application file for complete search history.

(56) References Cited

U.S. PATENT DOCUMENTS

2015/0154902 A1 6/2015 Lee et al.
2017/0261810 A1 9/2017 Murata et al.
(Continued)

FOREIGN PATENT DOCUMENTS

CN 101996605 A 3/2011
CN 104700765 A 6/2015
(Continued)

*Primary Examiner* — Adam R. Giesy

(57) ABSTRACT

A display substrate and a display apparatus are provided, and the display substrate includes: a base substrate including a display area and a bonding area located at a side of the display area, the display area includes a first circuit signal line and a second circuit signal line, and the bonding area includes a bonding signal pin; a circuit structure layer located in the display area. The circuit structure layer includes at least one first circuit region and at least one second circuit region; the first circuit region includes at least one first gate drive circuit; the second circuit region includes at least one second gate drive circuit; the first gate drive circuit includes multiple cascaded first gate drive units, and the second gate drive circuit includes multiple cascaded second gate drive units; the multiple the first gate drive units are sequentially arranged along a second direction.

19 Claims, 11 Drawing Sheets

(56) References Cited

U.S. PATENT DOCUMENTS

| | | | | |
|---|---|---|---|---|
| 2019/0355301 | A1 | 11/2019 | Lee | |
| 2020/0035185 | A1 | 1/2020 | Nishiyama et al. | |
| 2020/0111859 | A1 | 4/2020 | Ko et al. | |
| 2021/0375173 | A1* | 12/2021 | Wang | G09G 3/3233 |
| 2021/0398488 | A1 | 12/2021 | Park et al. | |
| 2022/0114933 | A1 | 4/2022 | Zhu et al. | |
| 2022/0180816 | A1 | 6/2022 | Yuan et al. | |
| 2023/0005445 | A1 | 1/2023 | Liu et al. | |
| 2023/0043145 | A1 | 2/2023 | Yuan et al. | |

FOREIGN PATENT DOCUMENTS

| | | | |
|---|---|---|---|
| CN | 105895018 | A | 8/2016 |
| CN | 106023944 | A | 10/2016 |
| CN | 108766249 | A | 11/2018 |
| CN | 110706599 | A | 1/2020 |
| CN | 110782853 | A | 2/2020 |
| CN | 110867139 | A | 3/2020 |
| CN | 111261094 | A | 6/2020 |
| CN | 111816123 | A | 10/2020 |
| CN | 112310125 | A | 2/2021 |
| CN | 113031352 | A | 6/2021 |
| CN | 113675254 | A | 11/2021 |
| CN | 113823660 | A | 12/2021 |
| CN | 113971940 | A | 1/2022 |
| WO | 2019001177 | A1 | 1/2019 |

* cited by examiner

DISPLAY SUBSTRATE AND DISPLAY APPARATUS

CROSS-REFERENCE TO RELATED APPLICATION

The present application is a U.S. National Phase Entry of International Application PCT/CN2022/078073 having an international filing date of Feb. 25, 2022, and the contents disclosed in the above-mentioned application are hereby incorporated as a part of this application.

TECHNICAL FIELD

Embodiments of the present disclosure relate to, but are not limited to, the field of display technologies, in particular to a display substrate and a display apparatus.

BACKGROUND

An Organic Light Emitting Diode (OLED for short) and a Quantum dot Light Emitting Diode (QLED for short) are active light emitting display devices and have advantages such as self-luminescence, wide viewing angle, high contrast ratio, low power consumption, very high response speed, lightness and thinness, flexibility, and low costs. With continuous development of display technologies, a display apparatus using the OLED or the QLED as a light emitting device and using a Thin Film Transistor (TFT) for signal control has become a mainstream product in the field of display at present.

With the development of display technology, consumers have growing requirements for display quality of display products, and extremely narrow bezel has become a new trend in the development of display products. Therefore, bezel narrowing is a technical problem to be solved urgently in this field.

SUMMARY

The following is a summary of subject matter described herein in detail. The summary is not intended to limit the protection scope of claims.

The present disclosure provides a display substrate, including: a base substrate including a display area and a bonding area located at a side of the display area, wherein the display area includes first circuit signal lines and a second circuit signal line, and the bonding area includes bonding signal pins; a circuit structure layer located in the display area. The circuit structure layer includes at least one first circuit region and at least one second circuit region; the at least one first circuit region includes at least one first gate drive circuit; the at least one second circuit region includes at least one second gate drive circuit; the at least one first gate drive circuit includes multiple cascaded first gate drive units, and the at least one second gate drive circuit includes multiple cascaded second gate drive units; the multiple the first gate drive units are sequentially arranged along a second direction, and the multiple second gate drive units are sequentially arranged along the second direction; the first circuit signal lines are coupled with the multiple first gate drive units and the bonding signal pins, and the second circuit signal lines are coupled with the multiple second gate drive units and the bonding signal pins.

In some exemplary implementations, the at least one first circuit region and the at least one second circuit region are misaligned in a first direction, and the first direction intersects with the second direction.

In some exemplary implementations, the arrangement position of the at least one first circuit region in the second direction and the arrangement position of the at least one second circuit region in the second direction are at least partially discontinuous, and the arrangement position of the at least one first circuit region in the first direction and the arrangement position of the at least one second circuit region in the first direction are at least partially different.

In some exemplary implementations, the base substrate further includes a signal trace area located between the display area and the bonding area, and the signal trace area includes multiple signal buses; the signal buses are respectively connected with the first circuit signal lines, the second circuit signal lines and the bonding signal pins; the first circuit signal lines are coupled with the multiple first gate drive units and the bonding signal pins, the second circuit signal lines are coupled with the multiple second gate drive units and the bonding signal pins, which includes: the first circuit signal lines are connected with the multiple first gate drive units, the signal buses and the bonding signal pins, and the second circuit signal lines are connected with the multiple second gate drive units, the signal buses and the bonding signal pins.

In some exemplary implementations, the display area further includes a first cascade signal line through which the at least one first gate drive circuit and the at least one second gate drive circuit are cascaded.

In some exemplary implementations, the first cascade signal line includes a first sub-cascade signal line and a second sub-cascade signal line, a first circuit region includes a stages of first gate drive units, a second circuit region includes (m-a) stages of second gate drive units, where a is a natural number greater than 1 and less than m, and m is a total stage number of the first gate drive units and the second gate drive units; an output signal end of a second gate drive unit in a first stage is connected with the reset signal input end of a first gate drive unit in a-th stage through the first sub-cascade signal line; an output signal end of the first gate drive unit in a-th first stage is connected with a signal input end of the second gate drive unit in the first stage through the second sub-cascade signal line.

In some exemplary implementations, two first circuit region are provided, the two first circuit regions are arranged along the first direction; the two second circuit region are provided, and the two second circuit regions are arranged along the first direction; two groups of first cascade signal lines are provided, wherein one of the first circuit regions and one of the second circuit regions are cascaded by a group of the first cascade signal lines, and the other of the first circuit regions and the other of the second circuit regions are cascaded by the other group of the first cascade signal lines.

In some exemplary implementations, where one of the first circuit regions and one of the second circuit regions are cascaded at sub-pixels of s-th row and the other of the first circuit regions and the other of the second circuit regions are cascaded at sub-pixels of t-th row, where s and t are both natural numbers and s is not equal to t.

In some exemplary implementations, a ratio of s to t is between 0.8 and 1.2.

In some exemplary implementations, the arrangement positions of each group of cascaded first second circuit region and second circuit region in the second direction are all discontinuous, and the arrangement positions of each group of cascaded first circuit region and second circuit region in the first direction are completely different.

In some exemplary implementations, the base substrate further includes a signal trace area between the display area and the bonding area, and the signal trace area includes multiple signal buses; the signal buses are respectively connected with the first circuit signal lines and the bonding signal pins, and the second circuit signal lines are connected with the first circuit signal lines; the first circuit signal lines are coupled with the multiple first gate drive units and the bonding signal pins, the second circuit signal lines are coupled with the multiple second gate drive units and the bonding signal pins, the first circuit signal lines are respectively connected with the multiple first gate drive units, the signal buses and the bonding signal pins, and the second circuit signal lines are respectively connected with the multiple second gate drive units, the first circuit signal lines, the signal buses and the bonding signal pins.

In some exemplary implementations, the base substrate further includes a third circuit region located at a side of the second circuit regions close to the bonding area, and the third circuit region is cascaded with the two second circuit regions.

In some exemplary implementations, the base substrate further includes a fourth circuit region located at a side of the first circuit regions away from the bonding area, the fourth circuit region and the two first circuit regions are cascaded.

In some exemplary implementations, the display area includes a third circuit signal line, and the third circuit region is connected with the bonding signal pins through the third circuit signal line and signal buses, and the fourth circuit region is connected with the bonding signal pins through the third circuit signal line and the signal buses.

In some exemplary implementations, the display area includes a first sub-display area, a second sub-display area, a third sub-display area, a fourth sub-display area, a fifth sub-display area, and a sixth sub-display area; The first sub-display area and the second sub-display area are arranged along the first direction; The third sub-display area and the fourth sub-display area are arranged along the first direction, the third sub-display area is located at the side of the first sub-display area close to the bonding area, and the fourth sub-display area is located at the side of the second sub-display area close to the bonding area; The sixth sub-display area is located at the side of the first sub-display area and the second sub-display area away from the bonding area, and the fifth sub-display area is located at the side of the third sub-display area and the fourth sub-display area close to the bonding area; the two first circuit regions are respectively located in the first sub-display area and the second sub-display area, two of the second circuit regions are respectively located in the third sub-display area and the fourth sub-display area, the third circuit region is located in the fifth sub-display area, and the fourth circuit region is located in the sixth sub-display area; At least one of the first circuit signal lines extends from the first sub-display area to the fifth sub-display area in the second direction, and at least another of the first circuit signal lines extends from the second sub-display area to the fifth sub-display area in the second direction; The second circuit signal line is located in the second circuit region and is multiple branch signal lines drawn from the first circuit signal line; the third circuit signal line extends from the sixth sub-display area to the fifth sub-display area in the second direction.

In some exemplary implementations, at least one of the first circuit signal lines and at least one of the second circuit signal lines are connected with a same bonding signal pin.

In some exemplary implementations, the bonding signal pins include power supply signal pins and clock signal pins, the clock signal pins at least include a first clock signal pin and a second clock signal pin.

In some exemplary implementations, the display area is substantially symmetrical about a center line in the first direction, and the first direction intersects with the second direction.

In some exemplary implementations, the display area is rectangular, heart-shaped, or elliptical in shape.

The present disclosure further provides a display apparatus including any one of the display substrate in anyone of the aforementioned embodiments.

Other aspects may be comprehended upon reading and understanding drawings and detailed descriptions.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure, but not to constitute limitations on the technical solutions of the present disclosure. Shapes and sizes of various components in the drawings do not reflect actual scales, but are only intended to schematically illustrate contents of the present disclosure.

DETAILED DESCRIPTION

Figure 1:
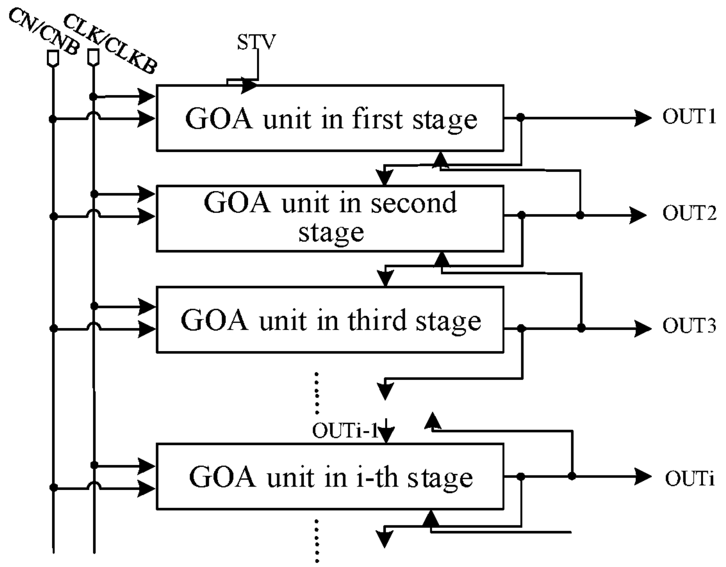
FIG. 1 is a schematic cascaded diagram of a gate drive circuit.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementation modes and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other if there is no conflict.

Scales of the drawings in the present disclosure may be used as a reference in an actual process, but are not limited thereto. For example, a width-length ratio of a channel, a thickness and spacing of each film layer, and a width and spacing of each signal line may be adjusted according to actual needs. The number of pixels in a display substrate and the number of sub-pixels in each pixel are not limited to the number shown in the drawings. The drawings described in the present disclosure are schematic structural diagrams only, and one implementation mode of the present disclosure is not limited to the shapes, numerical values or the like shown in the drawings.

Ordinal numerals such as “first”, “second”, and “third” in the specification are set to avoid confusion between constituent elements, but not to set a limit in quantity.

In the specification, for convenience, wordings indicating orientation or positional relationships, such as “middle”, “upper”, “lower”, “front”, “back”, “vertical”, “horizontal”, “top”, “bottom”, “inside”, and “outside”, are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms “mount”, “mutually connect”, and “connect” should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain terminal, drain region, or drain) and the source electrode (source terminal, source region, or source), and a current can flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the “source electrode” and the “drain electrode” are sometimes interchangeable. Therefore, the “source electrode” and the “drain electrode”, as well as the “source terminal” and the “drain terminal” are interchangeable in the specification.

In the specification, “electrical connection” includes a case that constituent elements are connected together through an element with a certain electrical effect. The “element with the certain electrical effect” is not particularly limited as long as electrical signals may be sent and received between the connected constituent elements. Examples of the “element with the certain electrical effect” not only include electrodes and wirings, but also include switch elements such as transistors, resistors, inductors, capacitors, other elements with various functions, etc.

In the specification, “parallel” refers to a state in which an angle formed by two straight lines is above −10° and below 10°, and thus also includes a state in which the angle is above −5° and below 5°. In addition, “perpendicular” refers to a state in which an angle formed by two straight lines is above 80° and below 100°, and thus also includes a state in which the angle is above 85° and below 95°.

In the specification, a “film” and a “layer” are interchangeable. For example, a “conductive layer” may be replaced with a “conductive film” sometimes. Similarly, an “insulating film” may be replaced with an “insulation layer” sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be guide angle, arc edge and deformation, etc.

In the present disclosure, “about” refers to that a boundary is defined not so strictly and numerical values within process and measurement error ranges are allowed.

Currently, as resolution of the display apparatus is gradually improved, and in order to ensure reliability and functionality of a bezel area, a bezel width of the existing display apparatus is about 1 mm. Pixels Per Inch (PPI) refers to the number of pixels per unit area, which can be called pixel density. The higher the PPI value, a picture with the higher density the display apparatus can display, and the richer the details of the picture. Since improvement of resolution not only needs increasing the number of gate drive circuits in the bezel area, which increases an area occupied by the gate drive circuit, but also needs to increase a width of a power supply line in the bezel area to reduce impedance and voltage drop of the power supply line and ensure the uniformity of the display brightness. Therefore, it is challenging to reduce the bezel by disposing the structure of the gate drive circuit in the bezel area.

In order to reduce the bezel of the display apparatus, gate drive circuits may be arranged in a display area, that is, the Gate Driver In AA (GIA) technology. Arrangement of the gate drive circuits in the display area may be similar to the arrangement of the gate drive circuits provided in the bezel area. For example, as shown in FIG. 1, a gate drive circuit includes multiple cascaded gate drive units (i.e., GOA units), which may be sequentially arranged from a gate drive unit of the first stage to a gate drive unit of the last stage along a direction.

Figure 2A:
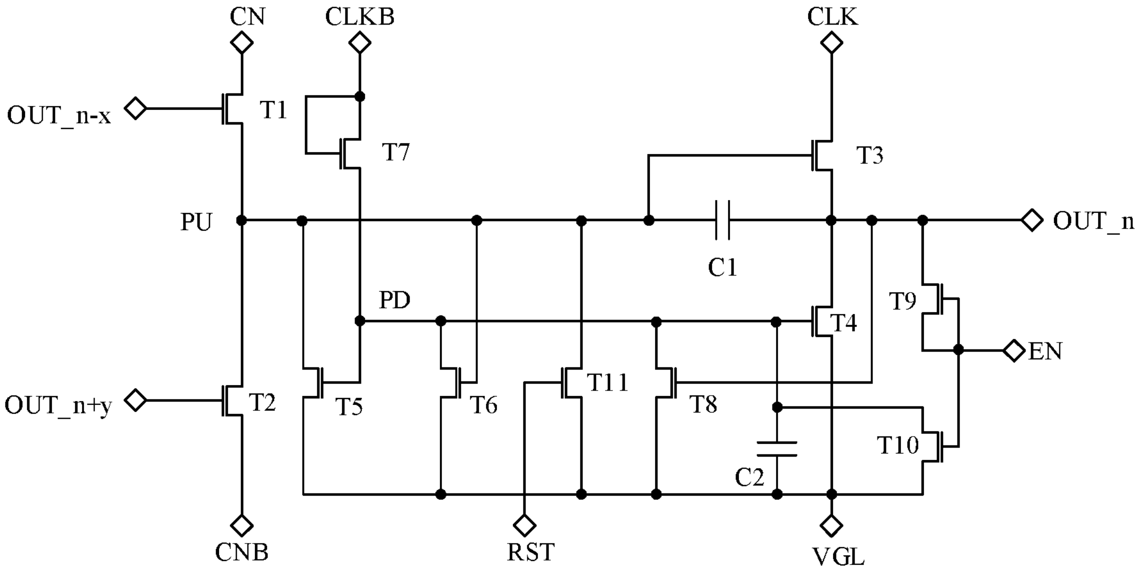
FIG. 2*a* is a schematic diagram of an equivalent circuit of a GOA circuit.

FIG. 2*a* is a schematic diagram of an equivalent circuit of a GOA circuit. In an exemplary implementation, the GOA circuit may include multiple transistors and multiple capacitors. As shown in FIG. 2*a*, the GOA circuit may include 11 transistors (first transistor T1 to eleventh transistor T11) and 2 capacitors C1 and C2. The GOA circuit is respectively connected with 10 signal lines (a first signal input line CN, a second signal input line CNB, a first clock signal line CLK, a second clock signal line CLKB, a reset signal line RST, a enable signal line EN, a low voltage power supply line VGL, an output signal line OUT_n−x in previous stage, an output signal line OUT_n+y in next stage and an output signal end OUT_n in the present stage), where x and y are both natural numbers greater than or equal to 1, and x and y may be equal or unequal.

In an exemplary implementation, taking a GOA circuit in n-th stage as an example, a first end of the first capacitor C1 is connected with a pull-up node PU, a second end of the first capacitor C1 is connected with an output signal end OUT_n in the present stage, a first end of the second capacitor C2 is connected with a pull-down node PD, and a second end of the second capacitor C2 is connected with the low voltage power supply line VGL.

A control electrode of the first transistor T1 is connected with the output signal line OUT_n−x in previous stage, a first electrode of the first transistor T1 is connected with the first signal input line CN, a second electrode of the first transistor T1 is connected with the pull-up node PU, and the output signal line OUT_n−x in the previous stage may be used as a first control line of the GOA circuit in the present stage.

A control electrode of the second transistor T2 is connected with the output signal line OUT_n+y in the next stage, a first electrode of the second transistor T2 is connected with the pull-up node PU, a second electrode of the second transistor T2 is connected with the second signal input line CNB, and the output signal line OUT_n+y in the next stage may be used as a second control line of the GOA circuit in the present stage.

A control electrode of the third transistor T3 is connected with the pull-up node PU, a first electrode of the third transistor T3 is connected with the first clock signal line CLK, and a second electrode of the third transistor T3 is connected with the output signal end OUT_n in the present stage which can be used as an output signal line of the GOA circuit in the present stage.

A control electrode of the fourth transistor T4 is connected with the pull-down node PD, a first electrode of the fourth transistor T4 is connected with the output signal end OUT_n in the present stage, and a second electrode of the fourth transistor T4 is connected to the low voltage power supply line VGL.

A control electrode of the fifth transistor T5 is connected with the pull-down node PD, a first electrode of the fifth transistor T5 is connected with the pull-up node PU, and a second electrode of the fifth transistor T5 is connected with the low voltage power supply line VGL.

A control electrode of the sixth transistor T6 is connected with the pull-up node PU, a first electrode of the sixth transistor T6 is connected with the pull-down node PD, and a second electrode of the sixth transistor T6 is connected with the low voltage power supply line VGL.

A control electrode and a first electrode of the seventh transistor T7 are connected with the second clock signal line CLKB, and a second electrode of the seventh transistor T7 is connected with the pull-down node PD.

A control electrode of the eighth transistor T8 is connected with the output signal end OUT_n in the present stage, a first electrode of the eighth transistor T8 is connected with the pull-down node PD, and a second electrode of the eighth transistor T8 is connected with the low voltage power supply line VGL.

A control electrode and a first electrode of the ninth transistor T9 are connected with the enable signal line EN, and a second electrode of the ninth transistor T9 is connected with the signal output end OUT_n in the present stage.

A control electrode of the tenth transistor T10 is connected with the enable signal line EN, a first electrode of the tenth transistor T10 is connected with the pull-down node PD, and a second electrode of the tenth transistor T10 is connected with the low voltage power supply line VGL.

A control electrode of the eleventh transistor T11 is connected with the reset signal end RST, a first electrode of the eleventh transistor T11 is connected with the pull-up node PU, and a second electrode of the eleventh transistor T11 is connected with the low voltage power supply line VGL.

In an exemplary implementation, when a level of the first clock signal line CLK is a valid level, a level of the second clock signal line CLKB is an invalid level, and when the level of the second clock signal line CLKB is a valid level, the level of the first clock signal line CLK is an invalid level, and the low voltage power supply line VGL continuously supplies a low-level signal.

In an exemplary implementation, a pulse duration of the valid level signal of the first clock signal line CLK and a pulse duration of the valid level signal of the second clock signal line CLKB may be equal.

In an exemplary implementation, the first transistor T1 to the eleventh transistor T11 may all be N-type thin film transistors or P-type thin film transistors, such that process flows may be unified and process preparation procedures may be reduced, which is conducive to improving the yield of products. Considering that a leakage current of a low-temperature polysilicon thin film transistor is small, the first transistor T1 to the eleventh transistor T11 may be low-temperature polysilicon thin film transistors, and the thin film transistors may have a bottom gate structure, a top gate structure or a double gate structure with a top gate and a bottom gate, which is not limited in the present disclosure as long as a switching function can be achieved.

Figure 2B:
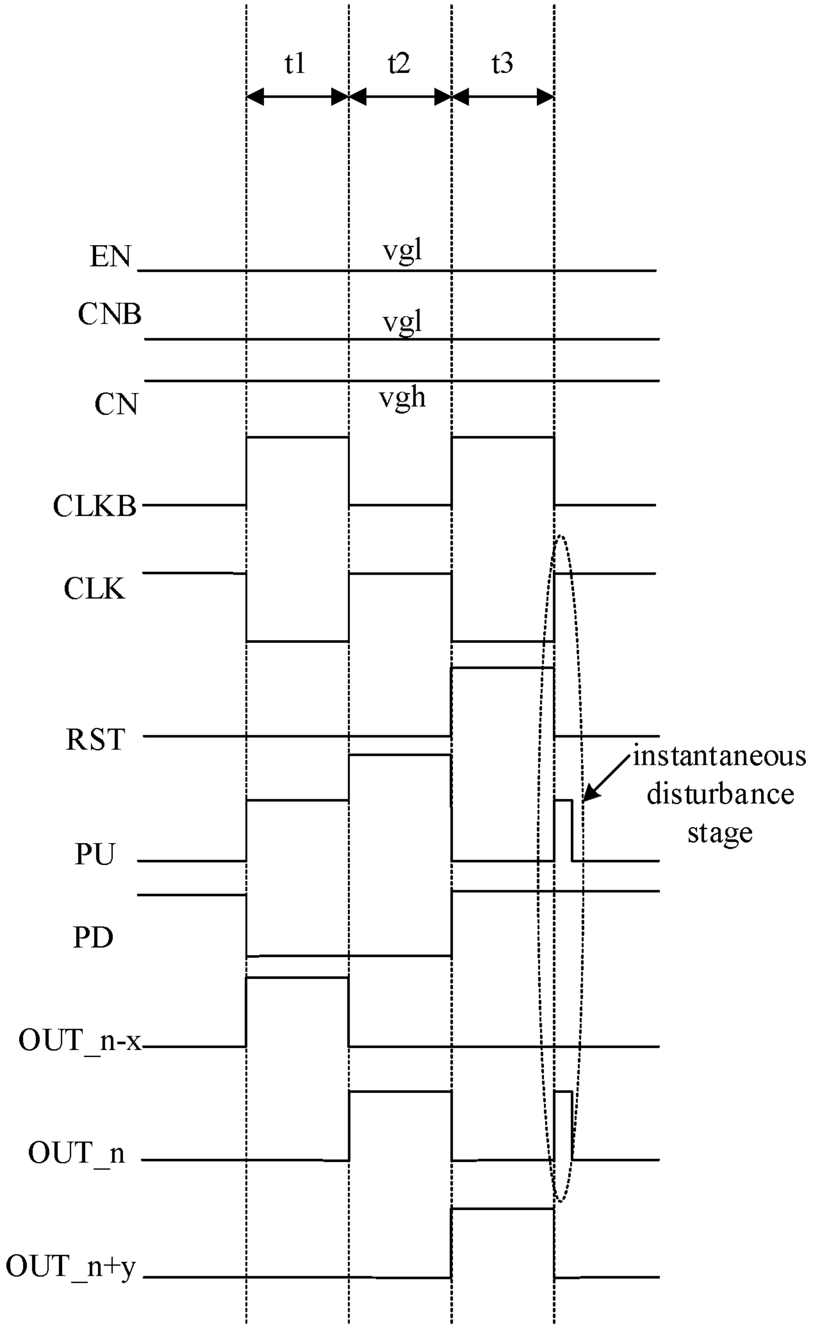
FIG. 2*b* is an operating timing diagram of the GOA circuit shown in FIG. 2*a*.

Taking the GOA circuit in n-th stage shown in FIG. 2*a* including the first transistor T1 to the eleventh transistor T11 of the N type as an example, as shown in FIG. 2*b*, an operation process of the GOA circuit in n-th stage may include:

In a first stage t1 (input stage), input signals of the output signal line OUT_n−x in the previous stage (first control line), the first signal input line CN and the second clock signal line CLKB are high level signals, and an input signal of the first clock signal line CLK is a low level signal. The high-level signal input from the output signal line OUT_n−x in the previous stage turns on the first transistor T1, pulls up the level of the pull-up node PU, and charges the first capacitor C1. Since the input signal of the first clock signal line CLK is the low-level signal, in the current stage there is no output signal at the output signal end OUT_n in the present stage. Although the input signal of the second clock signal line CLKB is the high level signal, such that the seventh transistor T7 is turned on, the pull-down node PD is pulled up, however, since the pull-up node PU is pulled up, the sixth transistor T6 is turned on, and a potential of the pull-down node PD is pulled down by the low voltage power supply line VGL (since a width of the sixth transistor T6 is larger than a width of the seventh transistor T7, the potential of the pull-down node PD is finally pulled down). Since the level of the output signal at the output signal end OUT_n in the present stage is low, the eighth transistor T8 is turned off, and the level of the pull-down node PD is kept low.

In a second stage t2 (output stage), the input signal of the first clock signal line CLK is a high-level signal, and the input signals of the output signal line OUT_n−x in the previous stage (first control line) and the second clock signal line CLKB are low-level signals. The low-level signal input by the output signal line OUT_n−x in the previous stage turns off the first transistor T1, the level of the pull-up node PU is continuously pulled up under a bootstrap effect of the first capacitor C1, the high level of the pull-up node PU turns on the third transistor T3, and the output signal end OUT_n in the present stage outputs the high level signal of the first clock signal line CLK, so that the output signal of the output signal end OUT_n in the present stage is high level. The pulled-up level of the pull-up node PU increases conductivity of the third transistor T3 and ensures charging ability of the pixel. The low-level signal input from the second clock signal line CLKB turns off the seventh transistor T7, the high level of the pull-up node PU still turns on the sixth transistor T6, and the high level of the output signal end OUT_n in the present stage turns on the eighth transistor T8, so that the pull-down node PD is pulled down to the low level of the low voltage power supply line VGL. The low level of the pull-down node PD turns off the fourth transistor T4 and the fifth transistor T5, so that the levels of the signals of the pull-up node PU and the output signal end OUT_n in the present stage are not pulled down, such that the output of the GOA circuit in the present stage can be ensured as normal.

In a third stage t3 (reset stage), input signals of the output signal line OUT_n+y in the next stage (second control line), the reset signal line RST and the second clock signal line CLKB are high level signals, and input signals of the second signal input line CNB and the first clock signal line CLK are low level signals. The high level signal input from the output signal line OUT_n+y in the next stage turns on the second transistor T2, and the level of the pull-up node PU is pulled down to the low level of the second signal input line CNB. The high-level signal input from the reset signal line RST turns on the eleventh transistor T11, and the level of the pull-up node PU is pulled down to the low level of the low voltage power supply line VGL. Since the level of the pull-up node PU is pulled down, the third transistor T3 and the sixth transistor T6 are turned off, there is no output from the output signal end OUT_n in the present stage. The high-level signal input from the second clock signal line CLKB turns on the seventh transistor T7, pulls up the pull-down node PD, charges the second capacitor C2, and the level of the pull-down node PD is high. Since the low level of the output signal end OUT_n in the present stage and the low level of the pull-up node PU turn off the sixth transistor T6 and the eighth transistor T8, the level of the pull-down node PD will not be pulled down. Since the high level of the pull-down node PD turns on the fourth transistor T4 and the fifth transistor T5, the levels of the pull-up node PU and the output signal end OUT_n in the present stage can be further pulled down to reduce noise.

In this embodiment, during displaying, the enable signal line EN inputs a continuous low-level signal; when power is cut off, the enable signal line EN inputs a high-level signal, the ninth transistor T9 and the tenth transistor T10 are turned on, the signal of VGL is written into the pull-down node PD, and the first capacitor C1 and the second capacitor C2 are discharged for power-off protection.

As shown in FIG. 2*b*, in the output stage of the GOA circuit in any other stage (i.e. the output signal end OUT_n of the GOA circuit in the present stage is low voltage), in the GOA circuit in the present stage, the pull-down node PD is maintained at a high voltage due to the presence of the second capacitor C2, however, when a rising edge of the first clock signal line CLK is reached, the voltage of the pull-up node PU is transiently and instantaneously raised, and then the fifth transistor T5 controlled by the pull-down node PD is discharged to the voltage of the low voltage power supply line VGL. This instantaneous raising will cause the third transistor T3 to be turned on transiently, that is, an instantaneous disturbance stage will be generated at this point (every time the rising edge of the first clock signal line CLK is reached, all GOA circuits with low output voltage signals will have such an instantaneous disturbance stage). Therefore, in order to reduce the instantaneous current in which the third transistor T3 is transiently turned upon large-scale driving, a manner in which the GIAs of left and right columns are driven simultaneously (dual-drive) can be adopted, so that the width W of the third transistor T3 (output tube) with GIAs of left and right columns can be designed to be smaller, thereby reducing the instantaneous current.

However, in display products with high PPI, the number of cascaded rows of gate drive units contained in the GIAs of left and right columns is relatively large, which causes the parasitic impedance load (RC Loading) between the clock signal line and the power supply line to be relatively large, and then causes a voltage value difference between a proximate end and a distal end of the low voltage power supply line VGL to be relatively large, which reduces the capability of driving.

Figure 3:
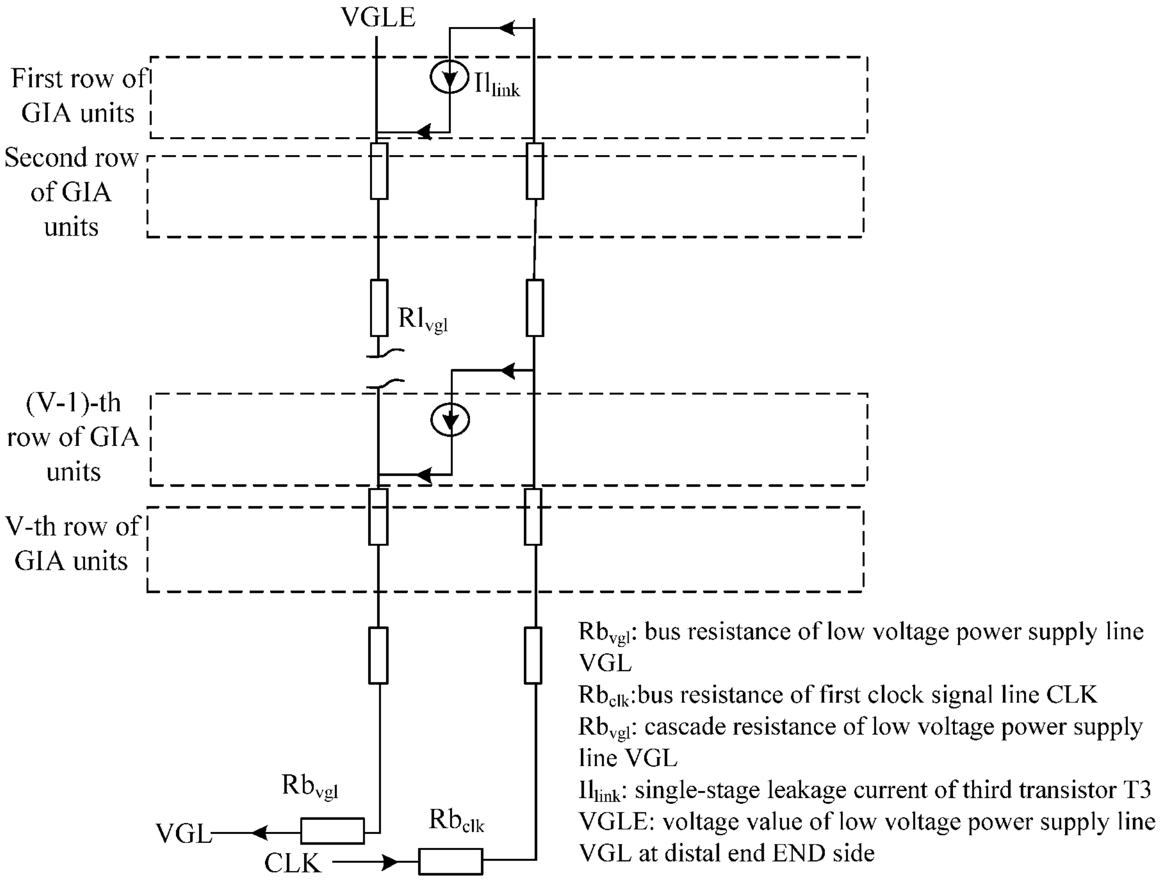
FIG. 3 is a schematic diagram of a theoretical calculation model of a distal end voltage value of a low voltage power supply line.

Referring to FIG. 3, assuming that a resolution of a display panel is H*V, where H is the number of columns of pixel units, and V is the number of rows of pixel units, the number of third transistors T3 connected with the first clock signal line CLK in the GIA of left column or the right column is V/2, and instantaneous currents of the third transistors T3 that are transiently turned on all flow into the low voltage power supply line VGL, then a voltage value VGLE of the distal end of the low voltage power supply line VGL can be obtained:

$$VGLE=\left[V/2+\frac{V(V/2-1)}{4}\right]Il_{link}*2Rl_{vgl}+Il_{link}*Rb_{vgl}*V/2+VGLe;$$

wherein, $Il_{link}$ is a single-stage leakage current of the third transistor T3, $Rl_{vgl}$ is a cascade resistance of the low voltage power supply line, $Rb_{vgl}$ is a bus resistance of the low voltage power supply line, VGLE is the voltage value of the distal end of the low voltage power supply line, VGLe is a voltage value of the proximate end of the low voltage power supply line.

As can be seen from the above equation, to ensure that the voltage values at the proximate end and the distal end of the low voltage power supply line to be close, in the case of same $Il_{link}$, it can be achieved only by reducing the values of $Rb_{vgl}$, $Rl_{vgl}$ and V, however, decreasing $Rb_{vgl}$, $Rl_{vgl}$ under high PPI brings challenge to the ability of an exposure machine or the process ability, which is obviously very difficult.

At least one embodiment of the present disclosure provides a display substrate, including:

a base substrate, including a display area and a bonding area located at a side of the display area, wherein the display area includes a first circuit signal line and a second circuit signal line, and the bonding area includes a bonding signal pin;

a circuit structure layer located in the display area;

the circuit structure layer includes at least one first circuit region and at least one second circuit region; the first circuit region includes at least one first gate drive circuit; the second circuit region includes at least one second gate drive circuit;

the first gate drive circuit includes multiple cascaded first gate drive units, and the second gate drive circuit includes multiple cascaded second gate drive units; the multiple first gate drive units are sequentially arranged along a second direction, and the multiple second gate drive units are sequentially arranged along the second direction;

the first circuit signal line is coupled with the multiple first gate drive units and the bonding signal pin, and the second circuit signal line is coupled with the multiple second gate drive units and the bonding signal pin.

In some embodiments of the present disclosure, "coupled" means that an electrical signal can be communicated, for example, A and B are coupled means that A and B can be electrically connected, where A and B can be connected directly or indirectly.

In some exemplary implementations, the display substrate of this embodiment may be an Organic Light Emitting Diode (OLED) display substrate or a Quantum-dot Light Emitting Diode (QLED) display substrate. However, no limits are made thereto in the present disclosure.

In some exemplary implementations, the first circuit region and the second circuit region are misaligned in a first direction, wherein the first direction intersects with the second direction.

In an exemplary implementation, the first direction may be perpendicular to the second direction.

In some exemplary implementations, an arrangement position of the first circuit region in the second direction and an arrangement position of the second circuit region in the second direction are at least partially discontinuous, and an arrangement position of the first circuit region in the first direction and an arrangement position of the second circuit region in the first direction are at least partially different.

In some exemplary implementations, the first circuit region may include at least one first gate drive circuit; and the second circuit region may include at least one second gate drive circuit. A quantity of first gate drive circuit(s) in the first circuit region may be the same as a quantity of second gate drive circuit(s) in the second circuit region. For example, the multiple first gate drive circuits of the first circuit region and the multiple second gate drive circuits of the second circuit region may be cascaded in one-to-one correspondence. In some examples, the display area further includes cascade signal lines through which the first gate drive circuits and the second gate drive circuits are cascaded.

In some exemplary implementations, the first cascade signal lines include a first sub-cascade signal line and a second sub-cascade signal line, the first circuit region includes a stages of first gate drive units, and the second circuit region includes (m-a) stages of second gate drive units, where a is a natural number greater than 1 and less than m, and m is a total number of stages of the first gate drive units and the second gate drive units.

An output signal end of the second gate drive unit of the first stage is connected with a reset signal input end of the first gate drive unit in a-th stage through the first sub-cascade signal line.

An output signal end of the first gate drive unit in a-th stage is connected with a signal input end of the second gate drive unit in the first stage through the second sub-cascade signal line.

In some examples, the first circuit region may include one first gate drive circuit (e.g., a scan drive circuit), and the second circuit region may include one second gate drive circuit (e.g., a scan drive circuit), the scan drive circuit in the first circuit region is cascaded with the scan drive circuit in the second circuit region. The first gate drive circuit and the second gate drive circuit may be configured to provide scan signals to multiple pixel circuits in the display area. In some other examples, the first circuit region may include two first gate drive circuits (e.g., a scan drive circuit and a light emitting drive circuit), the second circuit region may include two second gate drive circuits (e.g., a scan drive circuit and a light emitting drive circuit), the scan drive circuit in the first circuit region is cascaded with the scan drive circuit in the second circuit region, and the light emitting drive circuit in the first circuit region is cascaded with the light emitting drive circuit in the second circuit region. The scan drive circuits are configured to provide a scan signal and a reset signal to multiple pixel circuits in the display area, and the light emitting drive circuits are configured to provide a light emitting control signal to multiple pixel circuits in the display area. However, no limits are made thereto in the present disclosure.

In this embodiment, the grouping scheming does not need to set a start signal (STV) separately, and the output signal of the first circuit region can be directly used in a first gate drive unit cascaded to the second circuit region, thereby ensuring the integrity of the cascaded circuit.

In some exemplary implementations, the circuit structure layer may further include multiple rows of pixel circuits, wherein each row of pixel circuits include multiple pixel circuits arranged along the first direction. In some examples, in a plane parallel to the display substrate, the circuit structure layer may include multiple pixel circuits, multiple pixel circuits sequentially disposed along the first direction are referred to as one row of pixel circuits, and multiple pixel circuits sequentially disposed along the second direction are referred to as one column of pixel circuits. Multiple rows of pixel circuits and multiple columns of pixel circuits form a pixel circuit array. In some examples, the first direction may be a horizontal direction and the second direction may be a vertical direction. However, no limits are made thereto in the present disclosure.

In some exemplary implementations, in the first circuit region, the multiple rows of pixel circuits and multiple cascaded first gate drive units are arranged at intervals along the second direction. In the second circuit region, the multiple rows of pixel circuits and multiple cascaded second gate drive units are arranged at intervals along the second direction. In this example, the pixel circuits within the display area may be arranged in an array, and the first gate drive units and the second gate drive units may be disposed between pixel circuit rows. In some examples, in the first circuit region, a first gate drive unit is provided between pixel circuits in two adjacent rows in the second direction, in the second circuit region, a second gate drive unit is provided between pixel circuits in two adjacent rows in the second direction. For example, a first gate drive unit in an i-th stage may be located between pixel circuits in an (i−1)-th row and pixel circuits in an i-th row, and configured to provide a gate control signal to the pixel circuits in the i-th row, where i may be an integer. In this exemplary implementation, by arranging the first gate drive units or the second gate drive units between pixel circuits in adjacent rows, it is possible to achieve the layout of the gate drive circuit in the display area without affecting a display effect of the display substrate, thereby achieving a display product with a narrow bezel.

In the display substrate of the embodiment of the present disclosure, by connecting the first circuit region with the bonding signal pin through the first circuit signal line, and connecting the second circuit region with the bonding signal pin through the second circuit signal line, GOA cascade anomaly caused by the rising edge of a clock signal line (CLK or CLKB) upon low level output is effectively avoids, meanwhile, the number of cascaded rows of gate drive units connected with each circuit signal line is reduced, the overall parasitic RC between each circuit signal line is reduced, the voltage values at the proximate end and the distal end of the low voltage power supply line are ensured to be close, and the driving ability is improved.

Solutions of the embodiment will be described below through some examples.

Figure 4:
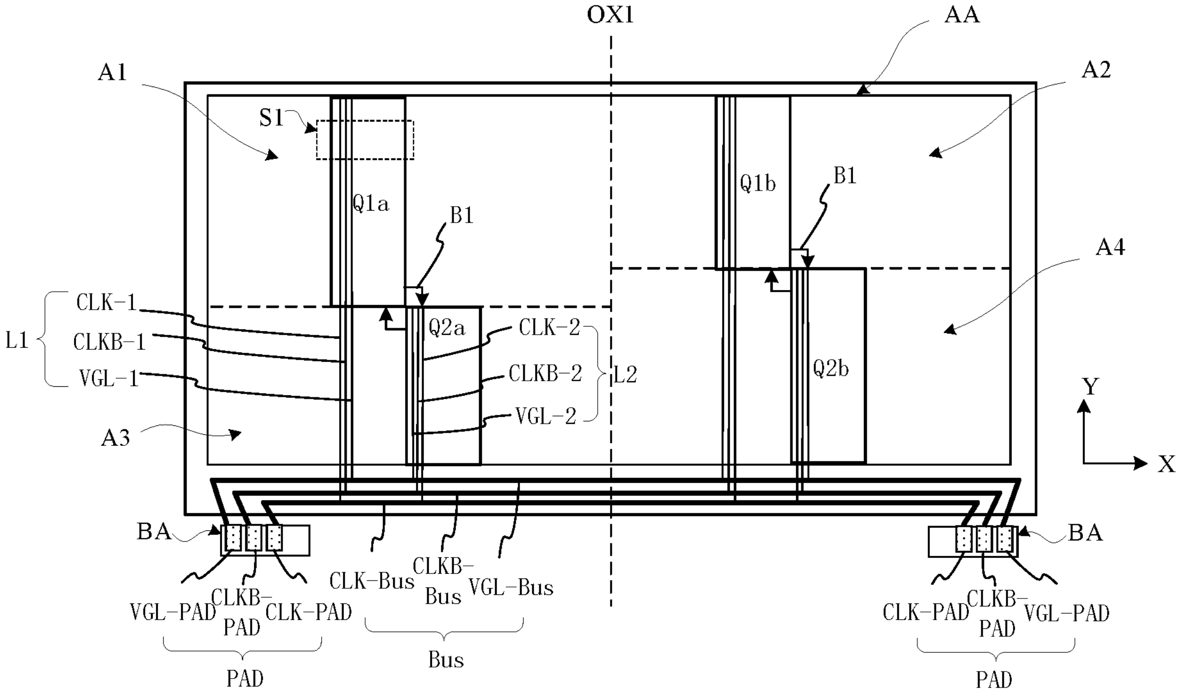
FIG. 4 is a schematic diagram of a structure of a display substrate according to at least one embodiment of the present disclosure.

FIG. 4 is a schematic diagram of a display substrate according to at least one embodiment of the present disclosure. In some exemplary implementations, as shown in FIG. 4, the display substrate of this embodiment may include a base substrate and a circuit structure layer disposed on the base substrate. The base substrate may include a display area AA and a border area (not shown) located outside the display area AA. In this example, the display area AA may have any shape such as a rectangle, a heart shape or an ellipse. In some exemplary implementations, the display area AA has a first center line OX1 in a first direction X. The display area AA may be substantially symmetrical about the first center line OX1. However, no limits are made thereto in the present disclosure.

In some exemplary implementations, the display area may be substantially symmetrical about a center line in the first direction. For example, the display area may be heart-shaped, letter Y-shaped, elliptical, annular, and so on. In some other exemplary implementations, the display area may be asymmetrical about the center line in the first direction. For example, the display area may be letter D-shaped, arc-shaped, C-shaped, etc. However, no limits are made thereto in the present disclosure.

In some exemplary implementations, the border area may include a bonding area BA located at a side of the display area AA and a bezel area located at the other sides of the display area AA. In an exemplary implementation, the display area AA may include multiple sub-pixels arranged in an array. The bonding area BA may at least include an isolation dam and a bonding circuit that connects signal lines of the multiple sub-pixels to an external driving apparatus. The bezel area may at least include an isolation dam and a power supply line for transmitting voltage signals to the multiple sub-pixels. The isolation dams of the bonding area BA and the bezel area form an annular structure surrounding the display area AA.

In some exemplary implementations, as shown in FIG. 4, the display area AA may include: at least one first sub-display area A1, at least one second sub-display area A2, at least one third sub-display area A3 and at least one third sub-display area A4. The at least one third sub-display area A3 and the at least one first sub-display area A1 may be arranged sequentially along the second direction Y, the at least one fourth sub-display area A4 and the at least one second sub-display area A2 may be arranged sequentially along the second direction Y, the at least one second sub-display area A2 and the at least one first sub-display area A1 may be arranged sequentially along the first direction X, and the at least one fourth sub-display area A4 and the at least one third sub-display area A3 may be arranged sequentially along the first direction X. In some examples, the first sub-display area A1, the second sub-display area A2, the third sub-display area A3, and the fourth sub-display area A4 may be communicated with each other.

In some exemplary implementations, as shown in FIG. 4, the bonding area BA includes multiple bonding signal pins PAD. Exemplarily, the bonding signal pins PAD may include power supply signal pins, clock signal pins, and the like. In some exemplary implementations, the power supply signal pins may include a low voltage power supply signal pin VGL-PAD; the clock signal pins may include a first clock signal pin CLK-PAD, a second clock signal pin CLKB-PAD, and the like.

In some exemplary implementations, as shown in FIG. 4, the base substrate further includes a signal trace area. The signal trace area is located between the display area AA and the bonding area BA (optionally, the signal trace area may be located at an edge of the display area AA close to the bonding area BA, or the signal trace area may be located at an edge of the bonding area BA close to the display area AA). The signal trace area may include multiple signal buses, such as a power supply signal bus (e.g. VGL-Bus) and a clock signal bus (e.g. CLK-Bus, CLKB-Bus). The power supply signal bus is connected with the power supply signal pins (e.g. VGL-PAD), and the clock signal bus is connected with the clock signal pins (e.g. CLK-PAD, CLKB-PAD).

In some exemplary implementations, the number of clock signal buses and the number of clock signal pins may be provided according to the number of drive clock signal lines of the GOA circuit. For example, when the GOA circuit includes four drive clock signal lines, four clock signal buses may be provided, and eight clock signal pins may be provided, and four clock signal pins are respectively disposed at each of the left side and right side of the bonding area BA along the first direction X, however, it is not limited in the present disclosure.

In some exemplary implementations, first circuit signal lines L1 include a first circuit clock signal connection line (e.g. CLK-1, CLKB-1) and a first circuit power supply signal connection line (e.g. VGL-1), the second circuit signal lines L2 include a second circuit clock signal connection line (e.g. CLK-2, CLKB-2) and a second circuit power supply signal connection line (e.g. VGL-2), the first circuit clock signal connection line (e.g. CLK-1, CLKB-1) and the second circuit clock signal connection line (e.g. CLK-2, CLKB-2) are respectively connected with the clock signal buses (e.g. CLK-Bus, CLKB-Bus), and the first circuit power supply signal connection line (e.g. VGL-1) and the second circuit power supply signal connection line (e.g. VGL-2) are respectively connected with the power supply signal bus (e.g. VGL-Bus).

In some exemplary implementations, as shown in FIG. 4, the first circuit signal lines L1 and the second circuit signal lines L2 extend along the second direction Y, and multiple signal buses extend along the first direction X.

In some exemplary implementations, as shown in FIG. 4, the circuit structure layer may be located in the display area AA of the base substrate. The circuit structure layer may include two first circuit regions Q1*a* and Q1*b* and two second circuit regions Q2*a* and Q2*b*. The two second circuit regions Q2*a* and Q2*b* are located at a same side of the two first circuit regions Q1*a* and Q1*b* in the second direction Y, and, for example, the two second circuit regions Q2*a* and Q2*b* are located at a side of the two first circuit regions Q1*a* and Q1*b* close to the bonding area BA. The two first circuit regions Q1*a* and Q1*b* may be arranged in sequence along the first direction X, and two second circuit regions Q2*a* and Q2*b* may be arranged in sequence along the first direction X. The second circuit region Q2*a* and the first circuit region Q1*a* are misaligned in the first direction X, and the second circuit region Q2*b* and the first circuit region Q1*b* are misaligned in the first direction X. For example, the second circuit region Q2*a* may be located at a side of the first circuit region Q1*a* close to or away from the first center line OX1, and the second circuit region Q2*b* may be located at a side of the first circuit region Q1*b* close to or away from the first center line OX1.

In some exemplary implementations, an arrangement position of the first circuit region Q1*a* (or Q1*b*) in the second direction Y and an arrangement position of the second circuit region Q2*a* (or Q2*b*) in the second direction Y are at least partially discontinuous, and an arrangement position of the first circuit region Q1*a* (or Q1*b*) in the first direction X and an arrangement position of the second circuit region Q2*a* (or Q2*b*) in the first direction X are at least partially different. For example, the arrangement position of the first circuit region Q1*a* (or Q1*b*) in the second direction Y and the arrangement position of the second circuit region Q2*a* (or Q2*b*) in the second direction Y are all discontinuous, and the arrangement position of the first circuit region Q1*a* (or Q1*b*) in the first direction X and the arrangement position of the second circuit region Q2*a* (or Q2*b*) in the first direction X are all different.

In some exemplary implementations, the first circuit signal lines L1 are coupled with multiple first gate drive units and bonding signal pins PAD, and the second circuit signal lines L2 are coupled with multiple second gate drive units and bonding signal pins PAD.

In some exemplary implementations, at least one signal line of the first circuit signal lines L1 and at least one signal line of the second circuit signal lines L2 are coupled with the same bonding signal pin PAD. For example, considering the limitation on the size of the bonding area BA, n signal lines of the first circuit signal lines L1 and n signal lines of the second circuit signal lines L2 may be arranged to be connected with n bonding signal pins PAD in one-to-one correspondence to minimize the number of bonding signal pins PAD, where n is a natural number greater than or equal to 1.

In some exemplary implementations, as shown in FIG. 4, the first circuit regions Q1*a* and Q1*b* may each include at least one first gate drive circuit. The second circuit regions Q2*a* and Q2*b* may each include at least one second gate drive circuit. The first gate drive circuits of the two first circuit regions Q1*a* and Q1*b* are cascaded with the second gate drive circuits of the second circuit regions Q2*a* and Q2*b* through a first cascade signal line B1. For example, the at least one first gate drive circuit of the first circuit area Q1*a* supplies a first cascade signal to the at least one second gate drive circuit of the second circuit area Q2*a* through the first cascade signal line B1, and the at least one first gate drive circuit of the first circuit area Q1*b* supplies a second cascade signal to the at least one second gate drive circuit of the second circuit area Q2*b* through the first cascade signal line B1.

In some exemplary implementations, multiple pixel circuits in the display area AA may be arranged in an array. In some examples, the number of rows of pixel circuits in the first sub-display area A1 and the number of rows of pixel circuits in the second sub-display area A2 may be different, and the number of rows of pixel circuits in the third sub-display area A3 and the number of rows of pixel circuits in the fourth sub-display area A4 may be different. For example, the at least one first gate drive circuit in the first circuit region Q1*a* may be configured to provide a gate control signal to s rows of pixel circuits in the first sub-display area A1 (for example, first row to s-th row of pixel circuits). The at least one first gate drive circuit in the first circuit region Q1*b* may be configured to provide a gate control signal to t rows of pixel circuits (for example, first row to t-th row pixel circuits) in the second sub-display area A2. The at least one second gate drive circuit in the second circuit region Q2*a* may be configured to provide a gate control signal to (N-s) rows of pixel circuits in (e.g., (s+1)-th row to N-th row of pixel circuits) in the third sub-display area A3. The at least one second gate drive circuit in the second circuit region Q2*b* may be configured to provide a gate control signal to (N-t) rows of pixel circuits in (e.g., (t+1)-th row to N-th row of pixel circuits) in the fourth sub-display area A4, where t, s and N are all natural numbers, and N is greater than s, N is greater than t, t≠s.

In this embodiment, considering that the RC loads of the clock signal lines on the left and right sides are quite different at the dual-drive grouping, the left and right columns are staggered at grouping, which can significantly reduce the horizontal stripe-like display defect (Mura) caused by grouping. The first circuit region Q1*a* and the second circuit region Q2*a* are misaligned at s-th row, the first circuit region Q1*b* and the second circuit region Q2*b* are misaligned at t-th row, where s is not equal to t.

In some examples, a quantity of rows of the pixel circuits in the first sub-display area A1 may be the same as or approximated to a quantity of rows of the pixel circuits in the second sub-display area A3.

In some exemplary implementations, a quantity of rows of the pixel circuits in the second sub-display area A2 may be the same as a quantity of rows of the pixel circuits in the fourth sub-display area A4.

Considering the need of reducing the stripe-like Mura caused by grouping, it is possible to make the number of rows of pixel circuits in only one group of a group consisting of the first sub-display area A1 and the third sub-display area A3, and a group consisting of the second sub-display area A2 and the fourth sub-display area A4 equal, and the number of rows of pixel circuits in the other group of the group consisting of the first sub-display area A1 and the third sub-display area A3, and the group consisting of the second sub-display area A2 and the fourth sub-display area A4 proximately equal. Alternatively, the number of rows of pixel circuits in both groups are proximately equal.

In some exemplary implementations, a ratio of t to s is not equal to 1 but close to 1, for example, the ratio of t to s may be between 0.8 and 1.2.

In some exemplary implementations, the first circuit region Q1*a* and the second circuit region Q2*a* are completely or not completely staggered in the first direction X, and the first circuit region Q1*b* and the second circuit region Q2*b* are completely or not completely staggered in the first direction X.

Figure 5:
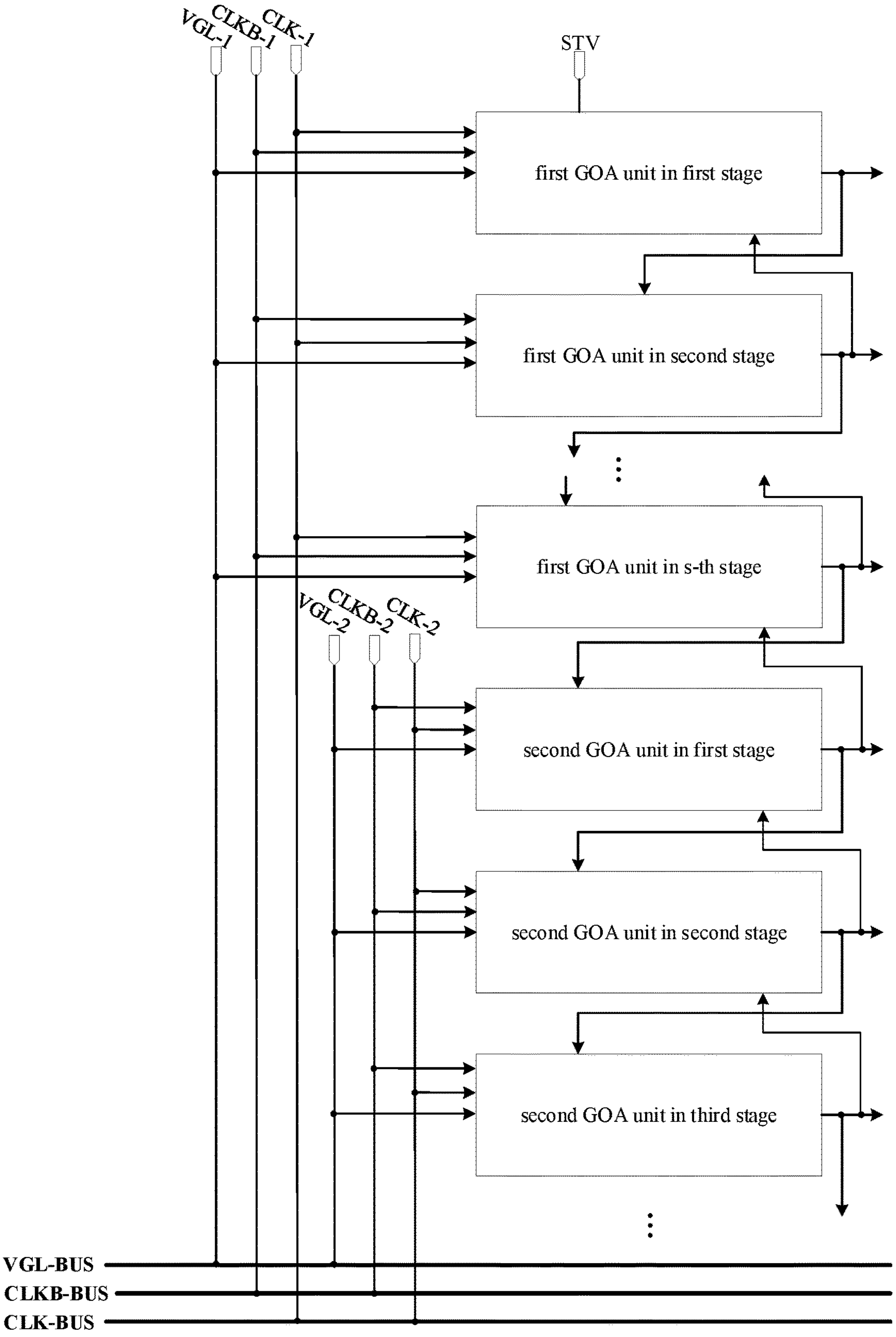
FIG. 5 is a schematic diagram of a cascade connection of a first gate drive circuit to a second gate drive circuit according to at least one embodiment of the present disclosure.

FIG. 5 is a schematic diagram of a cascade connection of a first gate drive circuit to a second gate drive circuit according to at least one embodiment of the present disclosure. In some exemplary implementations, as shown in FIG. 5, the first gate drive circuit may include multiple cascaded first gate drive units (i.e. first GOA units). The second gate drive circuit may include multiple cascaded second gate drive units (i.e. second GOA units). Circuit structures of the first gate drive unit and the second gate drive unit may be the same, which may be, for example, an 8T2C (i.e., eight transistors and two capacitors) configuration, or a 12T4C (i.e., twelve transistors and four capacitors) configuration, etc. However, no limits are made thereto in the present disclosure.

In some exemplary implementations, as shown in FIG. 5, a first gate drive unit in a first stage may generate a gate control signal provided to a pixel circuit in a first row according to an initial signal provided by an initial signal line STV, a first clock signal provided by a first sub-first clock signal line CLK-1, a second clock signal provided by a first sub-second clock line CLKB-1, and a low voltage signal provided by a first sub-low voltage power supply line VGL-1. A first gate drive unit in i-th stage can generate a gate control signal provided to a pixel circuit in i-th row according to a gate control signal generated by a first gate drive unit in (i−1)-th stage, the first clock signal provided by the first sub-first clock signal line CLK-1, the second clock signal provided by the first sub-second clock signal line CLKB-1, the low voltage signal provided by the first sub-low voltage power supply line VGL-1, where i is an integer between 2 and s. A second gate drive unit in the first stage can generate a gate control signal provided to a pixel circuit in (s+1)-th row according to a gate control signal generated by a first gate drive unit in s-th stage, a first clock signal provided by a second sub-first clock signal line CLK-2, a second clock signal provided by a second sub-second clock signal line CLKB-2, a low voltage signal provided by a second sub-low voltage power supply line VGL-2. A second gate drive unit in j-th stage can generate a gate control signal provided to a pixel circuit in (s+j)-th row according to a gate control signal generated by a second gate drive unit in (s+j−1)-th stage, the first clock signal provided by the second sub-first clock signal line CLK-2, the second clock signal provided by the second sub-second clock signal line CLKB-2, the low voltage signal provided by the second sub-low voltage power supply line VGL-2, where j is an integer between 2 and (N-s).

In some exemplary implementations as shown in FIG. 5, the first gate drive circuit of the first circuit region Q1*a* may include s cascaded first gate drive units, and the second gate drive circuit of the second circuit region Q2*a* may include (N-s) cascaded second gate drive units. In this example, a first gate drive unit in s-th stage is electrically connected with a second gate drive unit in the first stage, and provides a cascade signal (i.e., a gate control signal output by the first gate drive unit in s-th stage) to the second gate drive unit in the first stage, wherein the second gate drive unit in the first stage is a first gate drive unit in (s+1)-th stage. After the first gate drive circuits and the second gate drive circuits are cascaded, the gate control signal may be provided to N rows of pixel circuits. Similarly, the first gate drive circuit of the first circuit region Q1*b* may include t cascaded first gate drive units, and the second gate drive circuit of the second circuit region Q2*b* may include (N-t) cascaded second gate drive units. In this example, a first gate drive unit in t-th stage is electrically connected with a second gate drive unit in the first stage, and provides a cascade signal (i.e., a gate control signal output by the first gate drive unit in t-th stage) to the second gate drive unit in the first stage, wherein the second gate drive unit in the first stage is a first gate drive unit in (t+1)-th stage. After the first gate drive circuits and the second gate drive circuits are cascaded, the gate control signal may be provided to N rows of pixel circuits.

In some exemplary implementations, as shown in FIG. 4, multiple first gate drive units of the first gate drive circuit of the first circuit region Q1*a* may be sequentially arranged along the second direction Y in the first sub-display area A1. Multiple first gate drive units of the first gate drive circuit of the first circuit region Q1*b* may be sequentially arranged along the second direction Y in the second sub-display area A2. Multiple second gate drive units of the second gate drive circuit of the second circuit region Q2*a* may be sequentially arranged along the second direction Y in the third sub-display area A3. Multiple second gate drive units of the second gate drive circuit of the second circuit region Q2*b* may be sequentially arranged along the second direction Y in the fourth sub-display area A4. In some examples, the multiple first gate drive units of the first gate drive circuit of the first circuit region Q1*a* may not be misaligned in the first direction X, the multiple first gate drive units of the first gate drive circuit of the first circuit region Q1*b* may not be misaligned in the first direction X, the multiple second gate drive units of the second gate drive circuit of the second circuit region Q2*a* may not be misaligned in the first direction X, and the multiple second gate drive units of the second gate drive circuit of the second circuit region Q2*b* may not be misaligned in the first direction X. However, no limits are made thereto in the present disclosure.

In this exemplary embodiment, as shown in FIG. 4, arrangement positions of the first gate drive circuits in the first circuit area Q1*a* and the second gate drive circuits in the second circuit area Q2*a* are discontinuous in the second direction Y, and arrangement positions of the first gate drive circuits in the first circuit area Q1*b* and the second gate drive circuits in the second circuit area Q2*b* are discontinuous in the second direction Y. That is, the first gate drive circuits in the first circuit region Q1*a* and the second gate drive circuits in the second circuit region Q2*a* are misaligned in the first direction X, and the first gate drive circuits in the first circuit region Q1*b* and the second gate drive circuits in the second circuit region Q2*b* are misaligned in the first direction X.

Figure 6:
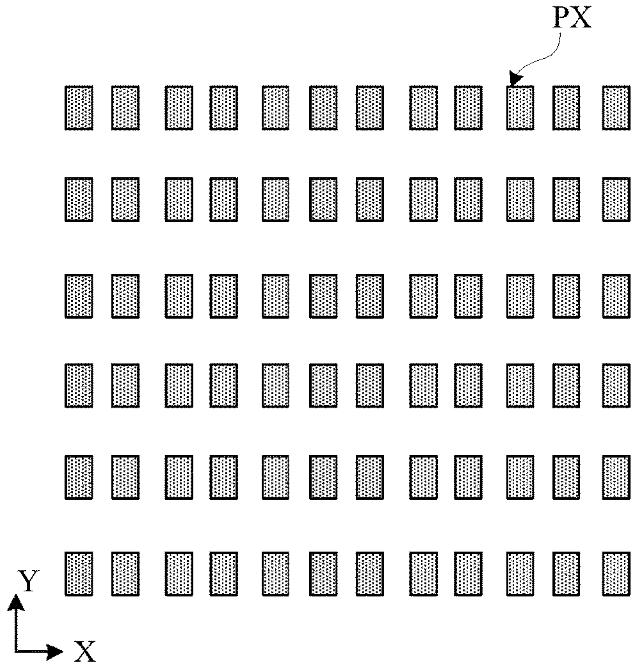
FIG. 6 is a schematic diagram of a partial layout of pixel circuits of a display substrate according to at least one embodiment of the present disclosure.

FIG. 6 is a schematic diagram of a partial layout of pixel circuits of a display substrate according to at least one embodiment of the present disclosure. In some exemplary implementations, as shown in FIG. 6, multiple pixel circuits (PXs) of the circuit structure layer may be arranged in an array in the display area AA. Multiple pixel circuits (PXs) arranged in the first direction X are one row of pixel circuits, and multiple pixel circuits (PXs) arranged in the second direction Y are one column of pixel circuits. A spacing between adjacent pixel circuit rows may be greater than a spacing between adjacent pixel circuit columns, so as to provide a layout space for the first gate drive circuits and the second gate drive circuits in the display area AA. In the display area AA, the spacing between adjacent pixel circuit rows may be substantially the same to ensure uniformity of the arrangement of the pixel circuits in the display area AA. In some examples, multiple first gate drive units and multiple second gate drive units may be respectively arranged between adjacent pixel circuit rows. However, no limits are made thereto in the present disclosure.

In some exemplary implementations, each Pixel Circuit (PX) in the circuit structure layer may be of a 3T1C (i.e. three transistors and one capacitor) configuration, a 5T1C (i.e. five transistors and one capacitor) configuration, a 6T1C (i.e. six transistors and one capacitor) configuration, or a 7T1C (i.e. seven transistors and one capacitor) configuration. In some examples, when the Pixel Circuit (PX) is of a 3T1C configuration, the first circuit region and the second circuit region may each include one gate drive circuit, for example, the first gate drive circuit and the second gate drive circuit may both be scan drive circuits to provide scan signals to multiple pixel circuits. In some examples, when the pixel circuit (PX) is of a 7T1C structure, the first circuit region and the second circuit region may each include two gate drive circuits, for example, two first gate drive circuits may be a scan drive circuit and a light emitting drive circuit, and two second gate drive circuits may be a scan drive circuit and a light emitting drive circuit, which provide a scan signal, a reset signal, and a light emitting control signal to multiple pixel circuits. However, no limits are made thereto in the present disclosure.

Figure 7A:
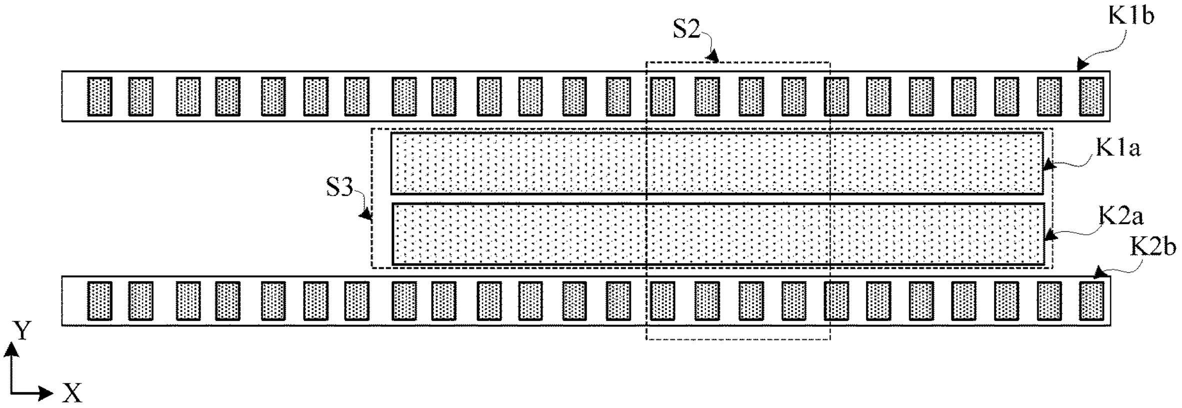
FIG. 7*a* is a partial schematic diagram of a region S1 in FIG. 4.

FIG. 7*a* is a partial schematic diagram of a region S1 in FIG. 4. FIG. 7*a* illustrates a partial structure of the first circuit region. In some exemplary implementations, as shown in th FIG. 7*a*, in the first circuit region Q1*a*, the multiple pixel circuit rows and multiple cascaded first gate drive units are arranged at intervals in the second direction Y. For example, in the second direction Y, pixel circuits K1*b* in i-th row, a first gate drive unit K1*a* in i-th stage, a first gate drive unit K2*a* in (i+1)-th stage, and pixel circuits K2*b* in (i+1)-th row are sequentially arranged. An output end of the first gate drive unit K1*a* in the i-th stage may be electrically connected with an input end of the first gate drive unit K2*a* in the (i+1)-th stage. The first gate drive unit K1*a* in the i-th stage may provide a gate control signal to the pixel circuits K1*b* in i-th row, and the first gate drive unit K2*b* in the (i+1)-th stage may provide a gate control signal to the pixel circuits K2*b* in the (i+1)-th row. However, no limits are made thereto in the present disclosure.

Figure 7B:
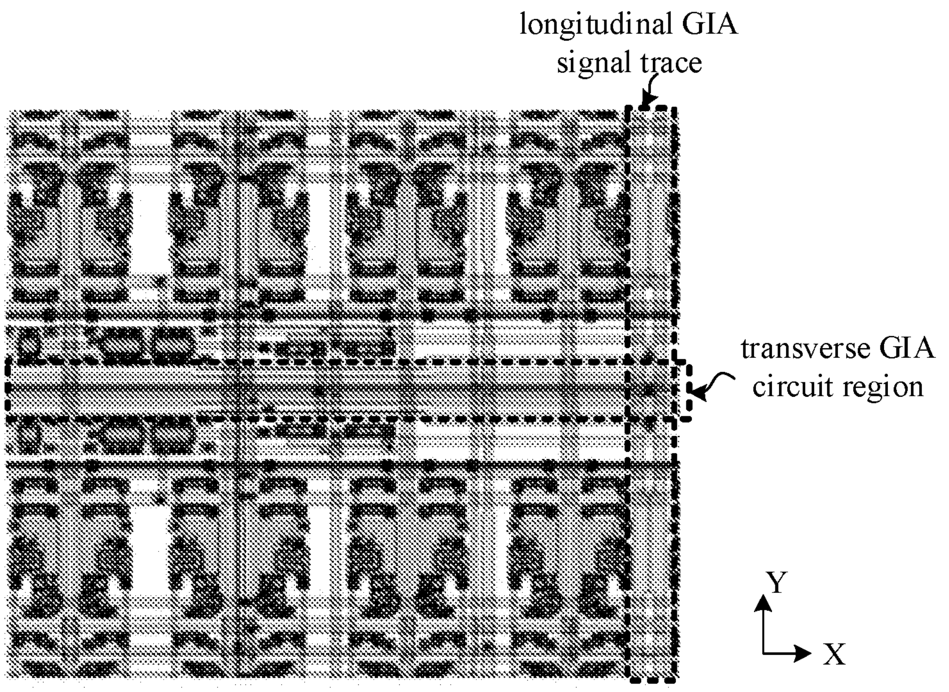
FIG. 7*b* is a partial schematic diagram of a region S2 in FIG. 7*b*.
Figure 7C:
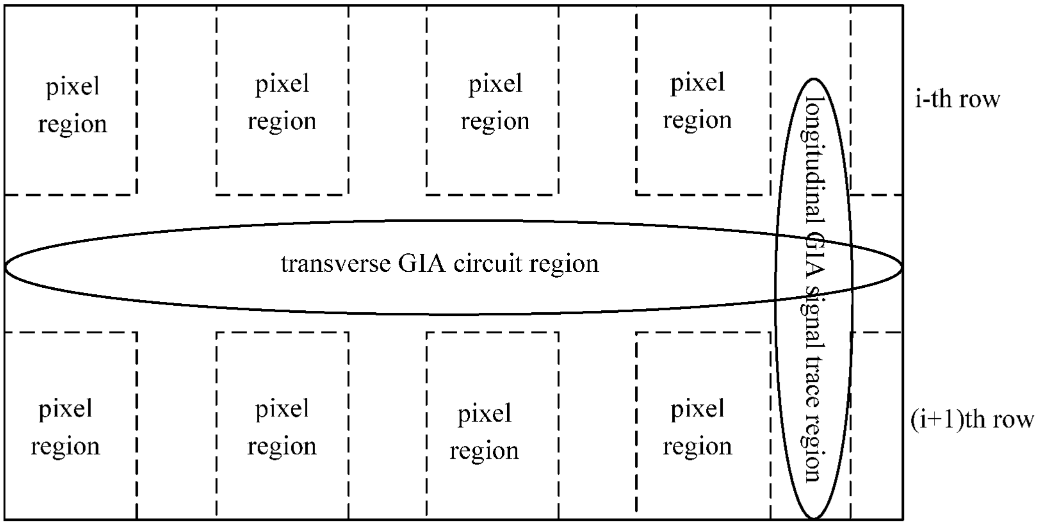
FIG. 7*c* is a schematic diagram of arrangement of a pixel circuit and a GOA circuit in FIG. 7*b;*

FIG. 7*b* is a partial schematic diagram of a region S2 in FIG. 7*a*, and FIG. 7*c* is a schematic diagram of arrangement of the pixel circuits and the GOA circuits in FIG. 7*b*. In some exemplary implementations, as shown in FIG. 7*a*, FIG. 7*b* and FIG. 7*c*, a gate circuit region of a GOA circuit in i-th stage and a GOA circuit in (i+1)-th stage may be located between two pixel circuit regions, a pixel circuit region of the gate circuit region at a side in the second direction Y may include a i-th unit row, and a pixel circuit region of the gate circuit region at a side in the opposite direction of the second direction Y may include a (i+1)-th unit row, thus forming a structure in which a two-stage GOA circuit is disposed between two unit rows.

In some exemplary implementations, the GOA circuits in each stage may be in a strip shape extending along the first direction X, and each unit row may include multiple circuit units arranged in sequence along the first direction X. A circuit unit may include a pixel drive circuit and a scan signal line, a data signal line, and a light emitting signal line connected with the pixel drive circuit.

Figure 7D:
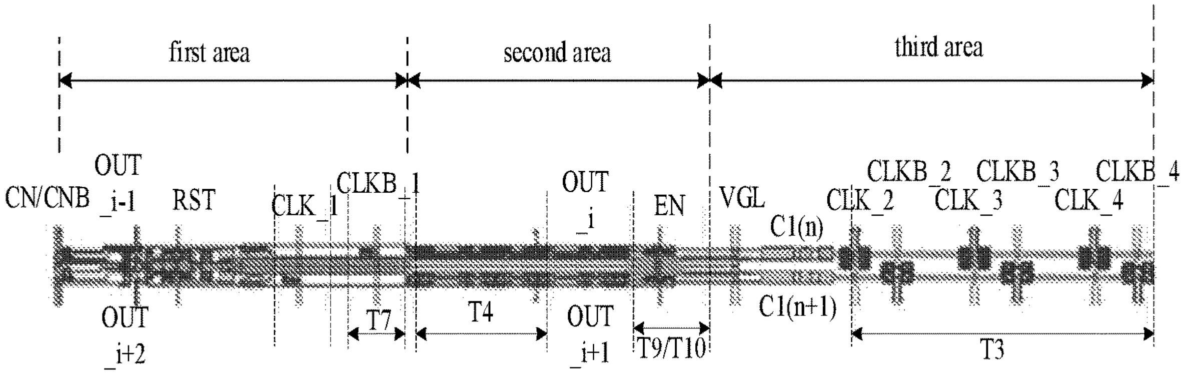
FIG. 7*d* is a partial schematic diagram of a region S3 in FIG. 7*a*.

In some exemplary implementations, FIG. 7*d* is a partial schematic diagram of a region S3 in FIG. 7*a*. As shown in FIG. 7*d*, the strip-shaped GOA circuit may include a first area, a second area, and a third area arranged in sequence along the first direction X, and the circuit structures in the three areas together constitute a complete GOA circuit in one stage.

In some exemplary implementations, a circuit structure of the first area may at least include an output signal line OUT_i−1 in a previous stage, a first signal input line CN, a second signal input line CNB, a first clock signal line CLK_1, a second clock signal line CLKB_1, a reset signal line RST, a second capacitor C2, a first transistor T1, a second transistor T2, a sixth transistor T6, an eighth transistor T8, an eleventh transistor T11, and the like. A circuit structure of the second area may at least include an output signal line OUT_i in the present stage, an output signal line OUT_i+1 in a next stage, an enable signal line EN, a fourth transistor T4, a ninth transistor T9, a tenth transistor T10, and the like. A circuit structure of the third area may at least include a low voltage power supply line VGL, multiple first clock signal lines CLK_2/CLK_3/CLK_4, multiple second clock signal lines CLKB_2/CLKB_3/CLKB_4, a first capacitor C1, multiple output transistors (third transistors T3), and the like. In some exemplary implementations, the first clock signal lines CLK_1, CLK_2, CLK_3, CLK_4 may be multiple branch connection lines branched from a first clock signal bus CLK_Bus, and the second clock signal lines CLKB_1, CLKB_2, CLKB_3, CLKB_4 may be multiple branch connection lines branched from a second clock signal bus CLKB_Bus.

In some exemplary implementations, the first gate drive circuit and the second gate drive circuit may be formed together with the pixel circuits in a process of forming the pixel circuits. For example, the transistors of the pixel circuits and the gate drive circuits may be P-type transistors or may be N-type transistors. Use of a same type of transistors in the pixel circuits and the gate drive circuits may simplify a process flow, reduce process difficulties of a display panel, and improve a product yield. In some possible implementation modes, the pixel circuits and the gate drive circuits may include P-type transistors and N-type transistors. However, no limits are made thereto in the present disclosure.

Figure 8:
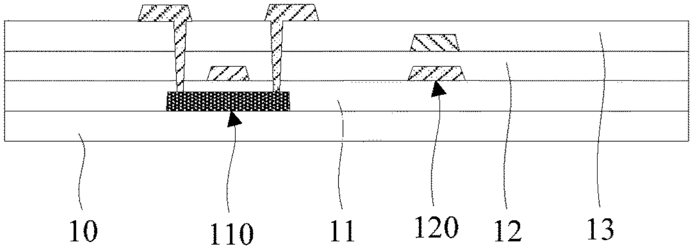
FIG. 8 is a schematic diagram of a partial section of a circuit structure layer according to at least one embodiment of the present disclosure.

FIG. 8 is a schematic diagram of a partial section of a circuit structure layer according to at least one embodiment of the present disclosure. In FIG. 8, a structure with one transistor 110 and one capacitor 120 are taken as an example for illustration. The transistor 110 and the capacitor 120 may be transistor and capacitor included in a pixel circuit or a gate drive unit. No limits are made thereto in the present disclosure.

In some exemplary implementations, as shown in FIG. 8, in a plane perpendicular to the display substrate, the circuit structure layer may include a semiconductor layer, a first conductive layer, a second conductive layer, and a third conductive layer disposed on the base substrate 10. A first insulating layer 11 is provided between the semiconductor layer and the first conductive layer, a second insulating layer 12 is provided between the first conductive layer and the second conductive layer, and a third insulating layer 13 is provided between the second conductive layer and the third conductive layer. The first to third insulating layers 11 to 13 may be inorganic insulating layers.

In some exemplary implementations, the base substrate 10 may be a flexible substrate or a rigid substrate. The semiconductor layer at least includes an active layer of the transistor 110. The first conductive layer at least includes a gate of the transistor 110 and a first electrode of the capacitor 120. The second conductive layer at least includes a second electrode of the capacitor 120. The third conductive layer at least includes first and second electrodes of the transistor 110. However, no limits are made thereto in the present disclosure. For example, the third conductive layer may further include a data line and a power supply line, and the first conductive layer or the second conductive layer may include a gate line.

In some exemplary implementations, a fourth insulating layer, a light emitting structure layer and an encapsulation layer may be sequentially disposed on a side of the third conductive layer away from the base substrate 10. The light emitting structure layer may include multiple light emitting elements, wherein at least one light emitting element may include an anode, a cathode, and an organic light emitting layer disposed between the anode and the cathode. The light emitting element is configured to emit light of a corresponding brightness in response to a current output by a pixel circuit electrically connected thereto. For example, the anode of the light emitting element may be electrically connected with the pixel circuit through a via provided on the fourth insulating layer, the organic light emitting layer may be in direct contact with the anode, and the cathode may be in direct contact with the organic light emitting layer. The organic light emitting layer of the light emitting element is driven by the anode and the cathode to emit light of a corresponding color. The encapsulation layer may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is provided between the first encapsulation layer and the third encapsulation layer to ensure that external water vapor cannot enter the light emitting structure layer. However, no limits are made thereto in the present disclosure. In some examples, the circuit structure layer further includes a fourth conductive layer located at the side of the third conductive layer away from the base substrate, and the fourth conductive layer may include a connection electrode that may be electrically connected with the third conductive layer and the anode of the light emitting element.

In some exemplary implementation modes, the organic light emitting layer may include a Hole Injection Layer (HIL), a Hole Transport Layer (HTL), an Electron Block Layer (EBL), Emitting Layer (EML), a Hole Block Layer (HBL), an Electron Transport Layer (ETL), and an Electron Injection Layer (EIL) which are stacked. In some exemplary implementations, hole injection layers of all light emitting elements may be connected together to form a common layer, electron injection layers of all the light emitting elements may be connected together to form a common layer, hole transport layers of all the light emitting elements may be connected together to form a common layer, electron transport layers of all the light emitting elements may be connected together to form a common layer, hole block layers of all the light emitting elements may be connected together to form a common layer, emitting layers of adjacent light emitting elements may be overlapped slightly or may be isolated from each other, and electron block layers of adjacent light emitting elements may be overlapped slightly or may be isolated from each other.

In some exemplary implementations, the light emitting structure layer may include a red light emitting element, a green light emitting element and a blue light emitting element, or may include a red light emitting element, a green light emitting element, a blue light emitting element and a white light emitting element, which are not limited herein in the present disclosure. In some exemplary implementations, a shape of a light emitting element may be a rectangle, a rhombus, a pentagon, or a hexagon. For example, in a case where one pixel unit includes three light emitting elements emitting three different colors respectively, the three light emitting elements may be arranged in parallel in a horizontal direction, in parallel in a vertical direction, or in a form of triangle. In a case where one pixel unit includes four light emitting elements, and the four light emitting elements may be arranged in parallel in a horizontal direction, in parallel in a vertical direction, or in a form of square, which is not limited in the present disclosure.

Figure 9A:
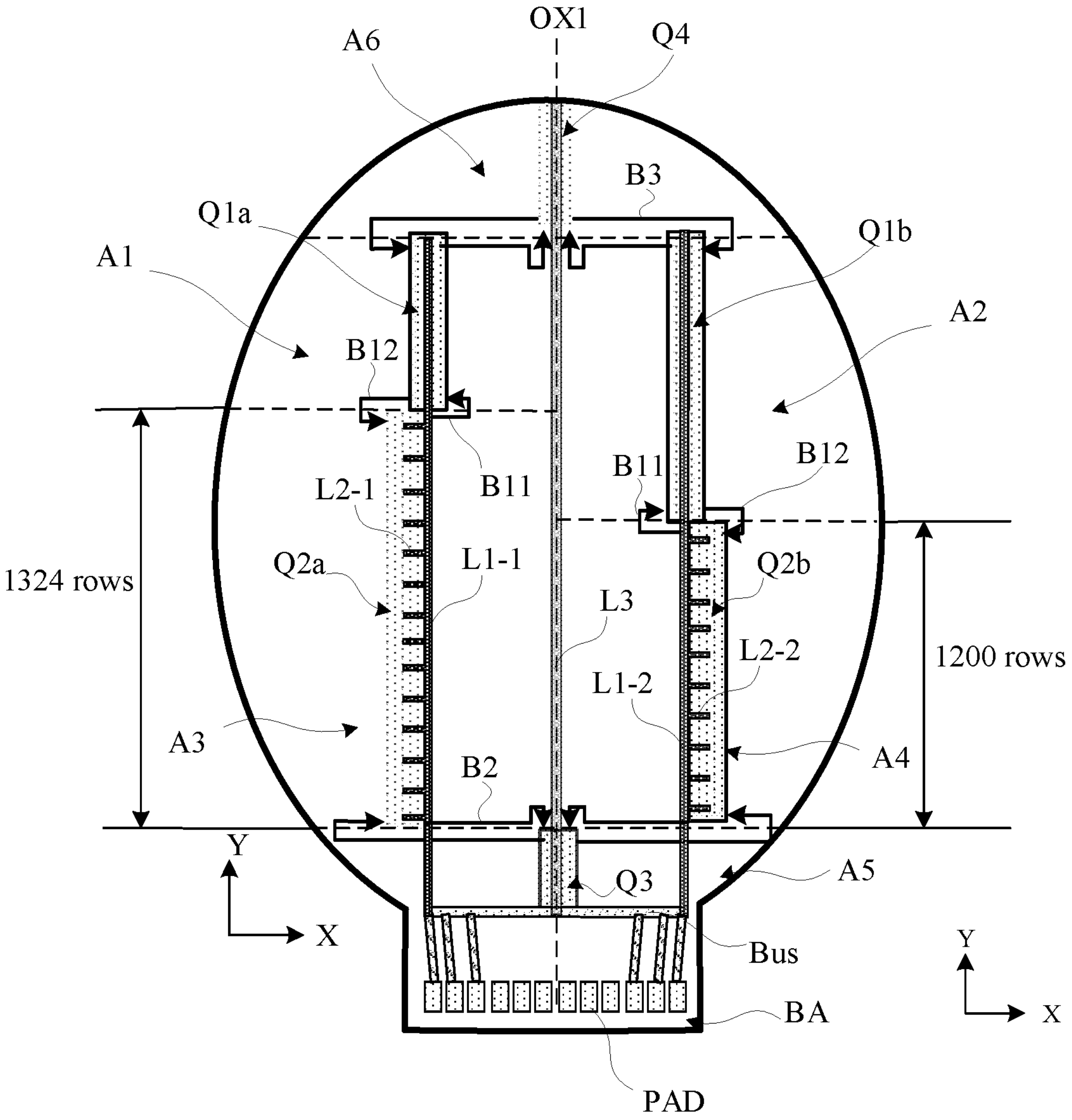
FIG. 9*a* is another schematic diagram of a display substrate according to at least one embodiment of the present disclosure.
Figure 9B:
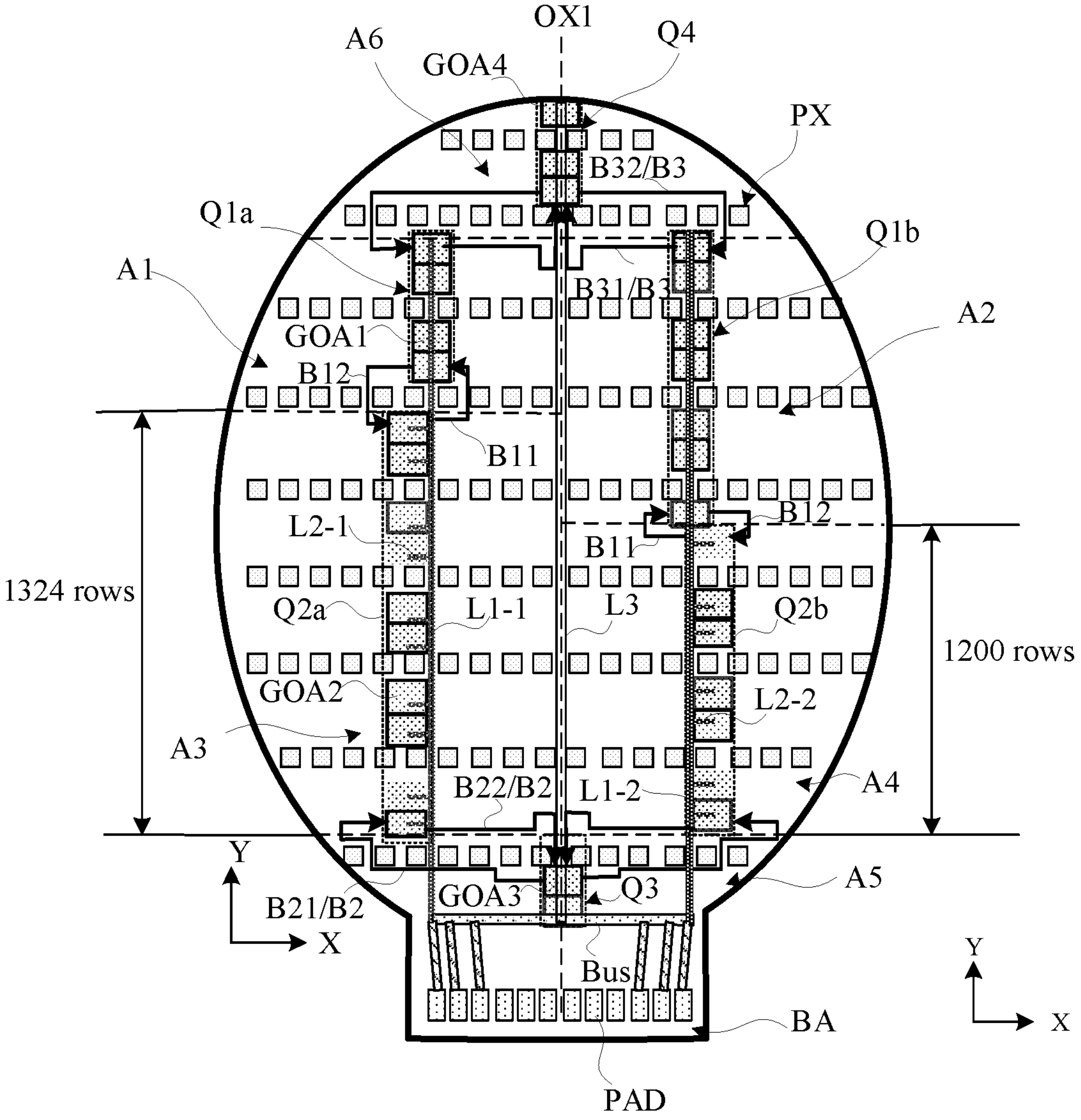
FIG. 9*b* is another schematic diagram of a display substrate according to at least one embodiment of the present disclosure.

In some exemplary implementations, as shown in FIG. 9*a* and FIG. 9*b*, the first circuit regions Q1*a* and Q1*b* each include multiple cascaded first gate drive units GOA1, the second circuit regions Q2*a* and Q2*b* each include multiple cascaded second gate drive units GOA2. The first circuit signal lines L1 include a first circuit signal line L1-1 and a first circuit signal line L1-2, and the first circuit signal line L1-1 and the first circuit signal line L1-2 extend along the second direction Y respectively. The first circuit signal line L1-1 transmits a common signal, such as a clock signal, a power supply signal and the like, for the multiple first gate drive units GOAL in the first circuit region Q1*a*, and the first circuit signal line L1-2 transmits a common signal, such as a clock signal, a power supply signal and the like, for the multiple first gate drive units GOAL in the first circuit region Q1*b*. The second circuit signal line L2 includes multiple second circuit signal lines L2-1 and multiple second circuit signal lines L2-2, wherein the multiple second circuit signal lines L2-1 are multiple branch connection lines branched from the first circuit signal line L1-1, the multiple second circuit signal lines L2-2 are multiple branch connection lines branched from the first circuit signal line L1-2, and the second circuit signal lines L2-1 and L2-2 extend along the first direction X respectively. The second circuit signal line L2-1 transmits a common signal, such as a clock signal, a power supply signal and the like, for the multiple second gate drive units GOA2 in the second circuit region Q2*a*, and the second circuit signal line L2-2 transmits a common signal, such as a clock signal, a power supply signal and the like, for the multiple second gate drive units GOA2 in the second circuit region Q2*b*. However, no limits are made thereto in the present disclosure. The number of the first circuit signal lines and the number of the second circuit signal lines may be provided as required, which are not limited in the present disclosure.

In some exemplary implementations, as shown in FIG. 9*a* and FIG. 9*b*, the first cascade signal lines B1 may include a first sub-cascade signal line B11 and a second sub-cascade signal line B12, the first circuit region Q1*a* (or Q1*b*) includes a first gate drive unit GOA1 in a-th stage, and the second circuit region Q2*a* (or Q2*b*) includes a second gate drive unit GOA2 in (m-a)-th stage, where a is a natural number greater than 1 and less than m, and m is a total number of stages of the first gate drive units GOA1 and the second gate drive units GOA2.

An output signal end of a second gate drive unit GOA2 in the first stage is connected with a reset signal input end of a first gate drive unit GOAL in a-th stage through the first sub-cascade signal line B11.

An output signal end of the first gate drive unit GOAL in a-th stage is connected with a signal input end of the second gate drive unit GOA2 in the first stage through the second sub-cascade signal line B12.

In some exemplary implementations, as shown in FIG. 9*a* and FIG. 9*b*, the display area may further include second cascade signal lines B2 and a third circuit signal line L3. The third circuit signal line L3 may be located between the two first circuit signal lines L1-1 and L1-2. The base substrate may further include a third circuit region Q3, and the third circuit region Q3 includes multiple cascaded third drive units GOA3. The third circuit region Q3 may be located at a side of the second circuit regions Q2*a* and Q2*b* close to the bonding area BA. The third circuit region Q3 is cascaded with the second circuit regions Q2*a* and Q2*b* respectively through the second cascade signal lines B2. The third circuit signal line L3 transmits a common signal, such as a clock signal, a power supply signal and the like, for multiple third drive units GOA3 of the third circuit region Q3. A width of the display substrate in the area where the third circuit region Q3 is located is narrower and can be driven in a joint driving manner. However, no limits are made thereto in the present disclosure.

In some exemplary implementations, as shown in FIG. 9*a* and FIG. 9*b*, the second cascade signal lines B2 may include a first sub-second cascade signal line B21 and a second sub-second cascade signal line B22. The third circuit region Q3 includes a third gate drive unit GOA3 in a2-th stage, the second circuit region Q2*a* includes a second gate drive unit GOA2 in a3-th stage, and the second circuit region Q2*b* includes a second gate drive unit GOA2 in a4-th stage, where each of a2, a3 and a4 are all natural numbers greater than 1.

An output signal end of a third gate drive unit GOA3 in the first stage is connected with a reset signal input end of the second gate drive unit GOA2 in a3-th stage of the second circuit region Q2*a* through the first sub-second cascade signal line B21.

An output signal end of the second gate drive unit GOA2 in a3-th stage of the second circuit region Q2*a* is connected with a signal input end of the third gate drive unit GOA3 in the first stage through the second sub-second cascade signal line B22.

An output signal end of the third gate drive unit GOA3 in the first stage is connected with a reset signal input end of the second gate drive unit GOA2 in the a4-th stage of the second circuit region Q2*b* through the first sub-second cascade signal line B21.

An output signal end of the second gate drive unit GOA2 in a4-th stage of the second circuit region Q2*b* is connected with the signal input end of the third gate drive unit GOA3 in the first stage through the second sub-second cascade signal line B22.

In some exemplary implementations, the display area further includes third cascade signal lines B3, and the base substrate may further include a fourth circuit region Q4. The fourth circuit region Q4 may include multiple cascaded fourth drive units GOA4. The fourth circuit region Q4 is located at a side of the first circuit regions Q1*a* and Q1*b* away from the bonding area BA. The fourth circuit region Q4 is respectively cascaded with the first circuit regions Q1*a* and Q1*b* through the third cascade signal lines B3, the third circuit signal line L3 transmits a common signal, such as a clock signal, a power supply signal and the like, for multiple fourth drive units GOA4 in the fourth circuit region Q4. A width of the display substrate in the area where the fourth circuit region Q4 is located is narrower and can be driven in a joint driving manner. However, no limits are made thereto in the present disclosure.

In some exemplary implementations, as shown in FIG. 9*a* and FIG. 9*b*, the third cascade signal lines B3 may include a first sub-third cascade signal line B31 and a second sub-third cascade signal line B32, and the fourth circuit region Q4 includes a fourth gate drive unit GOA4 in a5-th stage, where a5 is a natural number greater than 1.

An output signal end of a first gate drive unit GOAL in the first stage of the first circuit region Q1*a* is connected with a reset signal input end of the fourth gate drive unit GOA4 in a5-th stage through the first sub-third cascade signal line B31.

An output signal end of the fourth gate drive unit GOA4 in a5-th stage is connected with a signal input end of the first gate drive unit GOAL in the first stage of the first circuit region Q1*a* through the second sub-third cascade signal line B32.

An output signal end of the first gate drive unit GOAL in the first stage of the first circuit region Q1*b* is connected with the reset signal input end of the fourth gate drive unit GOA4 in a5-th stage through the first sub-third cascade signal line B31.

An output signal end of the fourth gate drive unit GOA4 in a5-th stage is connected with a signal input end of the first gate drive unit GOAL in the first stage of the first circuit region Q1*b* through the second sub-third cascade signal line B32.

In some exemplary implementations, the display area may include a first sub-display area A1, a second sub-display area A2, a third sub-display area A3, a fourth sub-display area A4, a fifth sub-display area A5, and a sixth sub-display area A6, wherein:

The first sub-display area A1 and the second sub-display area A2 are arranged along the first direction X. The third sub-display area A3 and the fourth sub-display area A4 are arranged along the first direction X, the third sub-display area A3 is located at a side of the first sub-display area A1 close to the bonding area BA, and the fourth sub-display area A4 is located at a side of the second sub-display area A2 close to the bonding area BA. The sixth sub-display area A6 is located at a side of the first sub-display area A1 and the second sub-display area A2 away from the bonding area BA, and the fifth sub-display area A5 is located at a side of the third sub-display area A3 and the fourth sub-display area A4 close to the bonding area BA.

In some exemplary implementations, the first circuit region Q1*a* is located in the first sub-display area A1, the first circuit region Q1*b* is located in the second sub-display area A2, the second circuit region Q2*a* is located in the third sub-display area A3, the second circuit region Q2*b* is located in the fourth sub-display area A4, the third circuit region Q3 is located in the fifth sub-display area A5, and the fourth circuit region Q4 is located in the sixth sub-display area A6.

In some exemplary implementations, the third circuit signal line L3 is coupled with multiple third drive units GOA3, multiple fourth drive units GOA4, a signal bus BUS, and a bonding signal pin PAD.

In some exemplary implementations, the first circuit signal line L1-1 extends from the first sub-display area A1 to the fifth sub-display area A5 along the second direction Y, and the first circuit signal line L1-2 extends from the second sub-display area A2 to the fifth sub-display area A5 along the second direction Y. The second circuit signal line L2-1 is located in the second circuit region Q2*a* and is multiple branch signal lines led out from the first circuit signal line L1-1, the second circuit signal line L2-2 is located in the second circuit region Q2*b* and is multiple branch signal lines led out from the first circuit signal line L1-2. The third circuit signal line L3 extends from the sixth sub-display area A6 to the fifth sub-display area A5 along the second direction Y.

In some exemplary implementations, the circuit structure layer may include k first circuit regions and q second circuit regions, first gate drive circuits in the k first circuit regions are cascaded with second gate drive circuits in the q second circuit regions. In some examples, the k and q may be integers greater than or equal to 1, and the k and the q are not 1 at the same time. In some examples, k=2 and q=1, that is, the circuit structure layer includes two first circuit regions and one second circuit region. The two first circuit regions are sequentially arranged in the first direction. The second circuit region is misaligned from the two first circuit regions in the first direction. A first gate drive circuit of a first one of the first circuit regions provides a first cascade signal to the second gate drive circuit of the second circuit region, a first gate drive circuit of the second one of the first circuit regions provides a second cascade signal to the second gate drive circuit of the second circuit region. The second gate drive unit in the first stage of the second gate drive circuit can output a gate control signal when the received first cascade signal and the second cascade signal are consistent. Impedance of a signal line for transmitting the first cascade signal may be substantially the same as impedance of a signal line for transmitting the second cascade signal. In this example, by configuring the impedance of the signal line for transmitting the first cascade signal to be substantially the same as the impedance of the signal line for transmitting the second cascade signal, consistency of the first cascade signal and the second cascade signal in a transmission process can be ensured.

In some exemplary implementations, in the display area AA, multiple gate lines extending in the first direction X may be located in the first conductive layer or the second conductive layer, multiple data lines and power supply lines extending along the second direction Y may be located in the third conductive layer. By disposing a signal bus BUS extending along the first direction X in the first conductive layer or the second conductive layer, and disposing a first circuit signal line L1 and a second circuit signal line L2 extending along the second direction Y in the third conductive layer, a trace arrangement can be facilitated and a design of intersected signal lines in a same layer can be avoided. However, no limits are made thereto in the present disclosure.

In the exemplary implementation, gate drive circuits provided in the display area is arranged in a segmented manner, and a driving mode of the pixel circuits in the display area is a mixed driving mode from a left and right separate driving to a joint driving, which can be applied to an abnormal cut display substrate with a peculiar structure, thereby supporting the realization of an abnormal cut display product with a narrow bezel.

Figure 10:
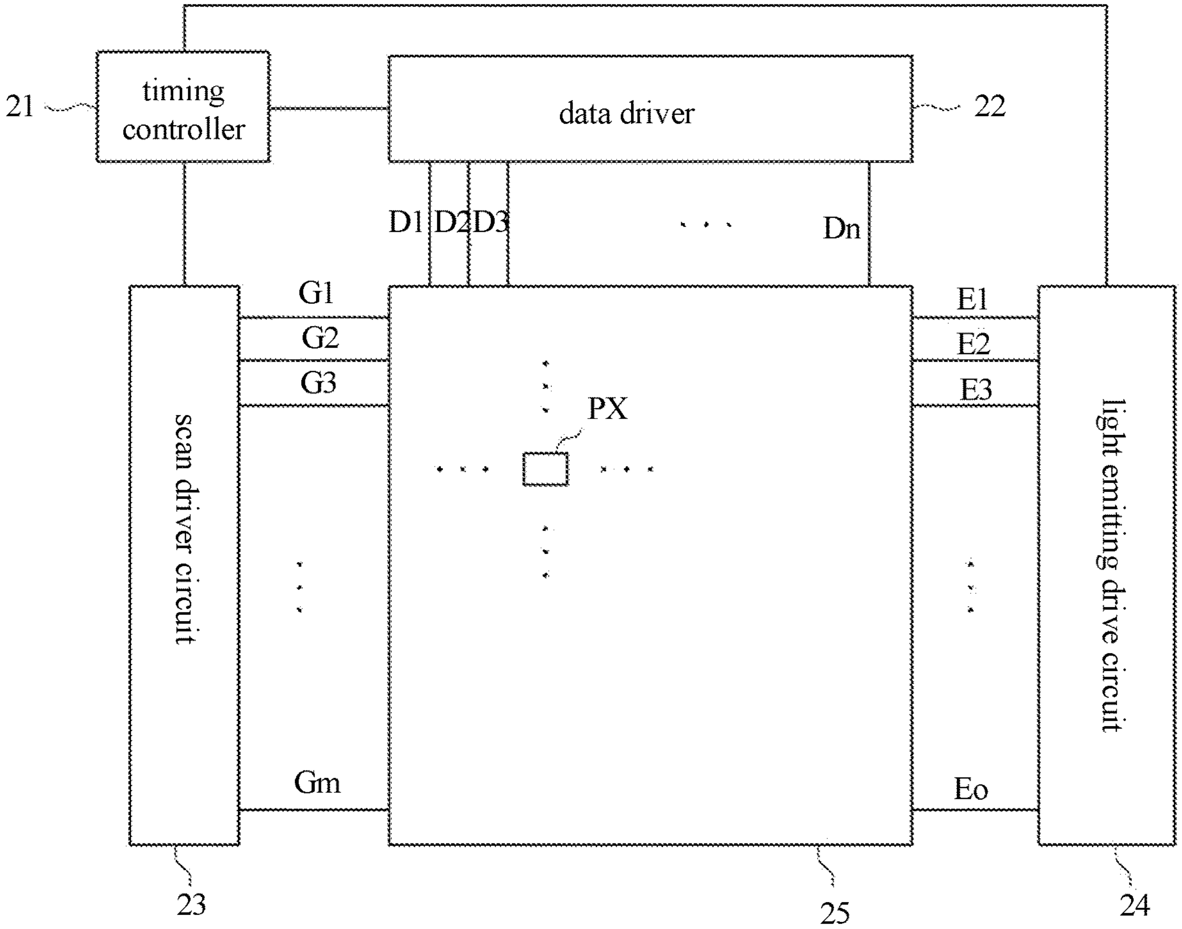
FIG. 10 is another schematic diagram of a display substrate according to at least one embodiment of the present disclosure.

FIG. 10 is a schematic diagram of a structure of a display substrate according to at least one embodiment of the present disclosure. In some exemplary implementations, as shown in FIG. 10, a display substrate may include a timing controller 21, a data driver 22, a gate driver circuit array and a pixel circuit array 25. The gate drive circuit array may include a first gate drive circuit array and a second gate drive circuit array. The first gate drive circuit array and the second gate drive circuit array may each include a scan drive circuit 23 and a light emitting drive circuit 24. The pixel circuit array 25 may include multiple Pixel Circuits (PXs) arranged in an array. In some examples, the scan drive circuit 23 is configured to provide a scan signal and a reset signal to multiple Pixel Circuits (PXs) and the light emitting drive circuit 24 is configured to provide a light emitting control signal to multiple Pixel Circuits (PXs).

In some exemplary implementations, the timing controller 21 may provide the data driver 22 with a gray-scale value and a control signal suitable for a specification of the data driver 22, provide the scan drive circuit 23 with a clock signal, a scanning start signal, etc., suitable for a specification of the scan drive circuit 23, and provide the light emitting drive circuit 24 with a clock signal, a light emitting start signal, etc., suitable for a specification of the light emitting drive circuit 24. The data driver 22 may generate a data voltage to be provided to the data lines D1, D2, D3 . . . and Dn using gray scale values and control signals received from the timing controller 21. For example, the data driver 22 may sample the gray-scale value using the clock signal and apply the data voltage corresponding to the gray-scale value to the data lines D1 to Dn by taking a pixel circuit row as a unit, where the n may be a natural number. The scan drive circuit 23 may generate a scan signal to be provided to the scanning lines S1, S2, S3 . . . and Sm by receiving the clock signal, the scan start signal, and the like from the timing controller 21. For example, the scan drive circuit 23 may sequentially provide the scan signals with on-level pulses to the scanning lines S1 to Sm. For example, the scan drive circuit 23 may be constructed in a form of a shift register and may generate a scan signal by transmitting sequentially the scan start signal provided in a form of a turn-on level pulse to a next-stage circuit under the control of the clock signal, where m may be a natural number. The light emitting drive circuit 24 may receive the clock signal, the light emitting start signal, etc., from the timing controller 21 to generate a light emitting control signal to be provided to light emitting signal lines E1, E2, E3, . . . and Eo. For example, the light emitting drive circuit 24 may be constructed in a form of a shift register, and may generate the light emitting control signal by sequentially transmitting a light emitting control signal provided in form of a cut-off level pulse to a next-stage circuit under the control of the clock signal, where o may be a natural number.

In some exemplary implementations, each pixel circuit may be of a 7T1C configuration. The first circuit region Q1*a* may include a first gate drive circuit array (including two first gate drive circuits, for example, the two first gate drive circuits may be a first scan drive circuit and a first light emitting drive circuit). The first circuit region Q1*b* may include a first gate drive circuit array (including two first gate drive circuits, for example, the two first gate drive circuits may be a first scan drive circuit and a first light emitting drive circuit). The second circuit region Q2*a* may include a second gate drive circuit array (including two second gate drive circuits, for example, the two second gate drive circuits may be a second scan drive circuit and a second light emitting drive circuit). The second circuit region Q2*b* may include a second gate drive circuit array (including two second gate drive circuits, for example, the two second gate drive circuits may be a second scan drive circuit and a second light emitting drive circuit). The first scan drive circuit may include multiple cascaded first scan drive units, the first light emitting drive circuit may include multiple cascaded first light emitting drive units, the second scan drive circuit may include multiple cascaded second scan drive units, and the second light emitting drive circuit may include multiple cascaded second light emitting drive units. For example, the first scan drive circuit in the first circuit region Q1*a* may be cascaded with the second scan drive circuit in the second circuit region Q2*b*, and the first scan drive circuit in the first circuit region Q1*b* may be cascaded with the second scan drive circuit in the second circuit region Q2*b*. The first light emitting drive circuit in the first circuit region Q1*a* may be cascaded with the second light emitting drive circuit in the second circuit region Q2*a*, and the first light emitting drive circuit in the first circuit region Q1*b* may be cascaded with the second light emitting drive circuit in the second circuit region Q2*b*.

In some exemplary implementations, circuit structures of the first scan drive units and the second scan drive units may be the same, circuit structures of the first light emitting drive units and the second light emitting drive units may be the same, and the circuit structures of the first scan drive units and the first light emitting drive units may be different. In some examples, the first scan drive units, the second scan drive units, the first light emitting drive units and the second light emitting drive units may each include multiple transistors and capacitors. However, no limits are made thereto in the present disclosure.

Figure 11:
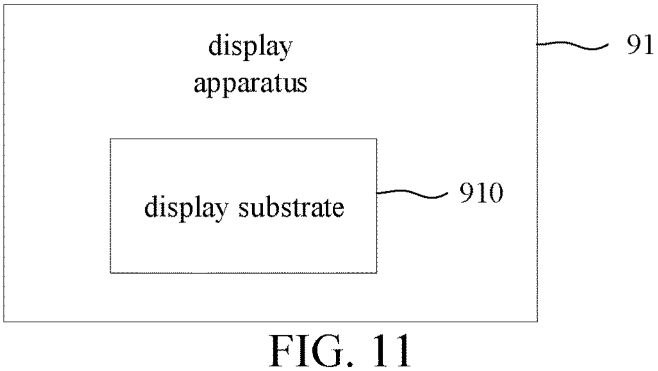
FIG. 11 is a schematic diagram of a display apparatus according to at least one embodiment of the present disclosure.

FIG. 11 is a schematic diagram of a display apparatus according to at least one embodiment of the present disclosure. As shown in FIG. 11, a display apparatus 91 is provided in this embodiment, which includes a display substrate 910 in the aforementioned embodiments. In some examples, the display substrate 910 may be an OLED display substrate or a QLED display substrate. The display apparatus 91 may be any product or component with a display function, such as a mobile phone, a tablet computer, a television, a display, a laptop computer, a digital photo frame, and a navigator. However, no limits are made thereto in the present disclosure.

In the display substrate provided by the present disclosure, by connecting the first circuit region with the bonding signal pin through the first circuit signal line, and connecting the second circuit region with the bonding signal pin through the second circuit signal line, the GOA cascade anomaly caused by the rising edges of clock signal lines upon low level output is effectively avoided, meanwhile, the number of cascaded rows of gate drive units connected with each circuit signal line is reduced, the overall parasitic RC between each circuit signal line is reduced, the voltage values at the proximate end and the distal end of the low voltage power supply line are ensured to be close, and the driving ability is improved. In addition, considering that the RC loads of the clock signal lines will be quite different at the grouping interface of the first circuit region and the second circuit region when the left and right sides are driven by dual drive, the horizontal stripe-like display defect (Mura) caused by grouping is significantly reduced by staggering the first circuit region and the second circuit region at the grouping interface according to the present disclosure. The preparation processes in the present disclosure may be compatible well with existing preparation processes, which is simple in process implementation, easy to implement, high in production efficiency and yield, and low in production cost.

Although the implementations disclosed in the present disclosure are described as above, the described contents are only implementations which are used for facilitating the understanding of the present disclosure, and are not intended to limit the present invention. Any skilled person in the art to which the present disclosure pertains may make any modification and variation in forms and details of implementation without departing from the spirit and scope of the present disclosure. However, the patent protection scope of the present invention should be subject to the scope defined by the appended claims.

The invention claimed is:

1. A display substrate, comprising:

a base substrate comprising a display area and a bonding area located at a side of the display area, wherein the display area comprises first circuit signal lines and second circuit signal lines, and the bonding area comprises bonding signal pins, and the base substrate further comprises a signal trace area located between the display area and the bonding area, the signal trace area comprises a plurality of signal buses; the signal buses are respectively connected with the first circuit signal lines, the second circuit signal lines and the bonding signal pins;

a circuit structure layer located in the display area; the circuit structure layer comprises at least one first circuit region and at least one second circuit region; the at least one first circuit region comprises at least one first gate drive circuit; the at least one second circuit region comprises at least one second gate drive circuit;

the at least one first gate drive circuit comprises a plurality of cascaded first gate drive units, and the at least one second gate drive circuit comprises a plurality of cascaded second gate drive units; the plurality of first gate drive units are sequentially arranged along a second direction, and the plurality of second gate drive units are sequentially arranged along the second direction; and the first circuit signal lines are coupled with the plurality of first gate drive units and the bonding signal pins, and the second circuit signal lines are coupled with the plurality of second gate drive units and the bonding signal pins, which comprises that the first circuit signal lines are connected with the plurality of first gate drive units, the signal buses and the bonding signal pins, and the second circuit signal lines are connected with the plurality of second gate drive units, the signal buses and the bonding signal pins.

2. The display substrate according to claim 1, wherein the at least one first circuit region and the at least one second circuit region are misaligned in a first direction, and the first direction intersects with the second direction.

3. The display substrate according to claim 2, wherein an arrangement position of the at least one first circuit region in the second direction and an arrangement position of the at least one second circuit region in the second direction are at least partially discontinuous, and an arrangement position of the at least one first circuit region in the first direction and an arrangement position of the at least one second circuit region in the first direction are at least partially different.

4. The display substrate according to claim 1, wherein the display area further comprises a first cascade signal line through which the at least one first gate drive circuit and the at least one second gate drive circuit are cascaded.

5. The display substrate according to claim 4, wherein the first cascade signal line comprises a first sub-cascade signal line and a second sub-cascade signal line, a first circuit region comprises (a) stages of first gate drive units, and a second circuit region comprises (m-a) stages of second gate drive units, where (a) is a natural number greater than 1 and less than (m), and (m) is a total number of stages of the first gate drive units and the second gate drive units;

an output signal end of a second gate drive unit in a first stage is connected with a reset signal input end of a first gate drive unit in a-th stage through the first sub-cascade signal line; and an output signal end of the first gate drive unit in a-th stage is connected with a signal input end of the second gate drive unit in the first stage through the second sub-cascade signal line.

6. The display substrate according to claim 4, wherein two first circuit regions are provided, and the two first circuit regions are arranged along a first direction; two second circuit regions are provided, and the two second circuit regions are arranged along the first direction; two groups of first cascade signal lines are provided;

one of the first circuit regions and one of the second circuit regions are cascaded by a group of the first cascade signal lines, and the other of the first circuit regions and the other of the second circuit regions are cascaded by the other group of the first cascade signal lines.

7. The display substrate according to claim 6, wherein one of the first circuit regions and one of the second circuit regions are cascaded at sub-pixels of s-th row, and the other of the first circuit regions and the other of the second circuit regions are cascaded at sub-pixels of t-th row, and s and t are both natural numbers, and s is not equal to t.

8. The display substrate according to claim 7, wherein a ratio of s to t is between 0.8 and 1.2.

9. The display substrate according to claim 6, wherein arrangement positions of each group of cascaded first second circuit region and second circuit region in the second direction are all discontinuous, and arrangement positions of each group of cascaded first circuit region and second circuit region in the first direction are completely different.

10. The display substrate according to claim 1, wherein at least one of the first circuit signal lines and at least one of the second circuit signal lines are connected with a same bonding signal pin.

11. The display substrate according to claim 1, wherein the bonding signal pins comprise power supply signal pins and clock signal pins, and the clock signal pins at least comprise a first clock signal pin and a second clock signal pin.

12. The display substrate according to claim 1, wherein the display area is substantially symmetrical about a center line in a first direction, and the first direction intersects with the second direction.

13. The display substrate according to claim 1, wherein the display area is rectangle, heart-shaped or elliptical.

14. A display apparatus, comprising the display substrate according to claim 1.

15. A display substrate, comprising:

a base substrate comprising a display area and a bonding area located at a side of the display area, wherein the display area comprises first circuit signal lines and second circuit signal lines, and the bonding area comprises bonding signal pins;

a circuit structure layer located in the display area; the circuit structure layer comprises at least one first circuit region and at least one second circuit region; the at least one first circuit region comprises at least one first gate drive circuit; the at least one second circuit region comprises at least one second gate drive circuit;

the at least one first gate drive circuit comprises a plurality of cascaded first gate drive units, and the at least one second gate drive circuit comprises a plurality of cascaded second gate drive units; the plurality of first gate drive units are sequentially arranged along a second direction, and the plurality of second gate drive units are sequentially arranged along the second direction; and the first circuit signal lines are coupled with the plurality of first gate drive units and the bonding signal pins, and the second circuit signal lines are coupled with the plurality of second gate drive units and the bonding signal pins, wherein the display area further comprises a first cascade signal line through which the at least one first gate drive circuit and the at least one second gate drive circuit are cascaded, wherein two first circuit regions are provided, and the two first circuit regions are arranged along a first direction; two second circuit regions are provided, and the two second circuit regions are arranged along the first direction; two groups of first cascade signal lines are provided;

one of the first circuit regions and one of the second circuit regions are cascaded by a group of the first cascade signal lines, and the other of the first circuit regions and the other of the second circuit regions are cascaded by the other group of the first cascade signal lines, and wherein the base substrate further comprises a signal trace area located between the display area and the bonding area, the signal trace area comprises a plurality of signal buses; the signal buses are respectively connected with the first circuit signal lines and the bonding signal pins, and the second circuit signal lines are connected with the first circuit signal lines; and the first circuit signal lines are coupled with the plurality of first gate drive units and the bonding signal pins, the second circuit signal lines are coupled with the plurality of second gate drive units and the bonding signal pins, the first circuit signal lines are respectively connected with the plurality of first gate drive units, the signal buses and the bonding signal pins, and the second circuit signal lines are respectively connected with the plurality of second gate drive units, the first circuit signal lines, the signal buses and the bonding signal pins.

16. The display substrate according to claim 15, wherein the display area further comprises a third circuit region and a second cascade signal line, the third circuit region is located at a side of the second circuit regions close to the bonding area, the third circuit region and the two second circuit regions are cascaded through the second cascade signal line respectively.

17. The display substrate according to claim 16, wherein the display area further comprises a fourth circuit region and a third cascade signal line, the fourth circuit region is located at a side of the first circuit regions away from the bonding area, the fourth circuit region and the two first circuit regions are cascaded through the third cascade signal line respectively.

18. The display substrate according to claim 17, wherein the display area comprises a third circuit signal line, the third circuit region comprises a plurality of cascaded third drive units, the fourth circuit region comprises a plurality of cascaded fourth drive units, and the third circuit signal line is coupled with the plurality of the third drive units, the plurality of the fourth drive units, the signal buses and the bonding signal pins.

19. The display substrate according to claim 18, wherein the display area comprises a first sub-display area, a second sub-display area, a third sub-display area, a fourth sub-display area, a fifth sub-display area, and a sixth sub-display area;

the first sub-display area and the second sub-display area are arranged along the first direction; the third sub-display area and the fourth sub-display area are arranged along the first direction, the third sub-display area is located at a side of the first sub-display area close to the bonding area, and the fourth sub-display area is located at a side of the second sub-display area close to the bonding area; the sixth sub-display area is located at a side of the first sub-display area and the second sub-display area away from the bonding area, and the fifth sub-display area is located at a side of the third sub-display area and the fourth sub-display area close to the bonding area;

the two first circuit regions are respectively located in the first sub-display area and the second sub-display area, the two second circuit regions are respectively located in the third sub-display area and the fourth sub-display area, the third circuit region is located in the fifth sub-display area, and the fourth circuit region is located in the sixth sub-display area; and at least one of the first circuit signal lines extends from the first sub-display area to the fifth sub-display area along the second direction, and at least another of the first circuit signal lines extends from the second sub-display area to the fifth sub-display area along the second direction; the second circuit signal lines are located in the second circuit regions and are a plurality of branch signal lines led out from the first circuit signal line; the third circuit signal line extends from the sixth sub-display area to the fifth sub-display area along the second direction.

* * * * *